(12) United States Patent
Saitoh et al.

(10) Patent No.: US 11,539,035 B2
(45) Date of Patent: Dec. 27, 2022

(54) OPTICAL DEVICE

(71) Applicant: FUJIFILM Corporation, Tokyo (JP)

(72) Inventors: Yukito Saitoh, Minami-ashigara (JP); Hiroshi Sato, Minami-ashigara (JP)

(73) Assignee: FUJIFILM Corporation, Tokyo (JP)

(*) Notice: Subject to any disclaimer, the term of this patent is extended or adjusted under 35 U.S.C. 154(b) by 148 days.

(21) Appl. No.: 17/012,803

(22) Filed: Sep. 4, 2020

(65) Prior Publication Data
US 2020/0403187 A1  Dec. 24, 2020

Related U.S. Application Data

(63) Continuation of application No. PCT/JP2019/008685, filed on Mar. 5, 2019.

(30) Foreign Application Priority Data

Mar. 6, 2018 (JP) .............................. JP2018-039651

(51) Int. Cl.
*H01L 51/52* (2006.01)
*G02B 5/30* (2006.01)
(Continued)

(52) U.S. Cl.
CPC ........ *H01L 51/5281* (2013.01); *G02B 5/3016* (2013.01); *G02B 27/283* (2013.01); *H01L 27/3232* (2013.01)

(58) Field of Classification Search
CPC ............ H01L 51/5281; H01L 27/3232; G02B 5/3016; G02B 27/283; G02B 27/286; B32B 7/023; H05B 33/02; H05B 33/12
See application file for complete search history.

(56) References Cited

U.S. PATENT DOCUMENTS

2006/0257586 A1* 11/2006 Umeya ................. C09K 19/02
 428/1.3
2008/0280107 A1* 11/2008 Katschorek .......... B42D 25/364
 252/299.01
(Continued)

FOREIGN PATENT DOCUMENTS

JP 2001-357979 A 12/2001
JP 2006-317656 A 11/2006
(Continued)

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2019/008685, dated Sep. 17, 2020, with an English translation.
(Continued)

*Primary Examiner* — S M Sohel Imtiaz
(74) *Attorney, Agent, or Firm* — Birch, Stewart, Kolasch & Birch, LLP

(57) ABSTRACT

An object of the present invention is to provide an optical device that can accomplish both the effect of preventing external light reflection and the improvement of utilization efficiency of light emitted from an organic electroluminescent element. The object is achieved by an optical device having an organic electroluminescent substrate, a circularly polarized light-separating layer separating light into right-handed circularly polarized light and left-handed circularly polarized light, a λ/4 plate, and a polarizer, wherein the circularly polarized light-separating layer has a liquid crystal alignment pattern in which a liquid crystal compound is twisted and aligned along a helical axis extending in a thickness direction and the direction of an optical axis
(Continued)

derived from the liquid crystal compound changes while continuously rotating in one direction in the plane.

10 Claims, 8 Drawing Sheets

(51) Int. Cl.
  *G02B 27/28* (2006.01)
  *H01L 27/32* (2006.01)

(56) References Cited

U.S. PATENT DOCUMENTS

| | | | |
|---|---|---|---|
| 2009/0040435 A1* | 2/2009 | Takahashi | G02F 1/13363 349/96 |
| 2011/0037683 A1* | 2/2011 | Park | H01L 27/3232 345/76 |
| 2012/0242918 A1* | 9/2012 | Valyukh | G02F 1/13718 349/33 |
| 2014/0284582 A1* | 9/2014 | Saitoh | G02F 1/133528 349/194 |
| 2015/0205182 A1* | 7/2015 | Leister | G02B 26/0808 349/201 |
| 2016/0011352 A1* | 1/2016 | Saitoh | H01L 27/3232 349/194 |
| 2016/0109630 A1* | 4/2016 | Ichihashi | G02B 5/3025 349/194 |
| 2016/0118448 A1* | 4/2016 | Epstein | H01L 51/5271 257/40 |
| 2018/0164480 A1* | 6/2018 | Yoshida | G02B 5/10 |
| 2019/0072701 A1* | 3/2019 | Murashige | B32B 7/12 |
| 2020/0003392 A1* | 1/2020 | Kang | H05K 1/181 |
| 2020/0142213 A1 | 5/2020 | Sato et al. | |

FOREIGN PATENT DOCUMENTS

| | | |
|---|---|---|
| JP | 2007-532959 A | 11/2007 |
| JP | 2009-259721 A | 11/2009 |
| JP | 2011-40365 A | 2/2011 |
| JP | 2016-524290 A | 8/2016 |
| JP | 2017-22016 A | 1/2017 |
| WO | WO 2016/194961 A1 | 12/2016 |
| WO | WO 2019/004442 A1 | 1/2019 |

OTHER PUBLICATIONS

International Search Report (Form PCT/ISA/210) for International Application No. PCT/JP2019/008685, dated Jun. 4, 2019.

* cited by examiner

OPTICAL DEVICE

CROSS-REFERENCE TO RELATED APPLICATIONS

This application is a Continuation of PCT International Application No. PCT/JP2019/008685 filed on Mar. 5, 2019, which claims priority under 35 U.S.C. § 119(a) to Japanese Patent Application No. 2018-039651 filed on Mar. 6, 2018. The above application is hereby expressly incorporated by reference, in its entirety, into the present application.

BACKGROUND OF THE INVENTION

1. Field of the Invention

The present invention relates to an optical device using organic electroluminescence.

2. Description of the Related Art

In recent years, as a display device replacing a liquid crystal display device, organic electroluminescence (organic electro luminescence (EL) (organic light emitting diode (OLED)) has been developed continuously, and a 60-inch large display device (display) has started appearing.

The surface of the organic EL substrate constituting the organic EL display device has a high reflectance. Accordingly, particularly in a bright environment, the surface reflects external light and deteriorates contrast.

Therefore, the surface of the organic EL display device is provided with an antireflection film consisting of a polarizer and a λ/4 plate.

For example, JP2009-259721A describes an organic EL display device comprising an organic EL element portion which consists of a reflecting electrode, an organic EL light emitting layer, and a transparent electrode and a circular polarization plate which consists of a retardation plate and a polarizing plate, in which an antireflection layer having a high reflectance in a wavelength range of complementary color of the color of light reflected from the surface of the circular polarization plate is provided in an air interface of a member closer to an observer than to the circular polarization plate.

Furthermore, JP2017-022016A describes a circular polarization plate for an organic EL display device and an organic EL display device comprising the circular polarization plate, in which the circular polarization plate comprises a polarizer, a retardation layer functioning as a λ/4 plate, a barrier layer, and a pressure sensitive adhesive layer functioning as a barrier in this order, and the barrier layer is thin glass having a thickness of 5 to 100 μm.

SUMMARY OF THE INVENTION

Such an organic EL display device is provided with an antireflection film (circular polarization plate) consisting of a polarizer and a λ/4 plate so as to prevent the reflection of external light and to enable the device to display images with high contrast.

However, the antireflection film consisting of a polarizer and a λ/4 plate also absorbs the light emitted from an organic EL element. Therefore, the conventional organic EL display device has low light use efficiency, and cannot fully demonstrate the performance of the organic EL element.

An object of the present invention is to solve the above problem of the conventional technique and to provide an optical device using organic EL that can accomplish both the effect of preventing external light reflection and the improvement of utilization efficiency of light emitted from an organic EL element.

In order to achieve the object, the optical device according to an embodiment of the present invention has the following constitution.

[1] An optical device including, in the following order, an organic electroluminescent substrate having light emitting portions by organic electroluminescence and a non-light emitting portion which has a metallic reflecting portion, a circularly polarized light-separating layer that is formed using a composition including a liquid crystal compound and has a liquid crystal alignment pattern in which the liquid crystal compound is twisted and aligned along a helical axis extending in a thickness direction and a direction of an optical axis derived from the liquid crystal compound changes while continuously rotating along at least one direction in a plane, a λ/4 plate, and a polarizer.

[2] The optical device described in [1], in which the circularly polarized light-separating layer transmits one of left-handed circularly polarized light and right-handed circularly polarized light and reflects the other such that light emitted from the light emitting portions of the organic electroluminescent substrate is separated into right-handed circularly polarized light and left-handed circularly polarized light.

[3] The optical device described in [1], in which the circularly polarized light-separating layer rectilinearly transmits one of right-handed circularly polarized light and left-handed circularly polarized light and refractively transmits the other such that light emitted from the light emitting portions of the organic electroluminescent substrate is separated into right-handed circularly polarized light and left-handed circularly polarized light.

[4] The optical device described in [3], in which the circularly polarized light-separating layer also reverses a sense of rotation of the refractively transmitted circularly polarized light.

[5] The optical device described in any one of [1] to [4], in which the organic electroluminescent substrate has the light emitting portions emitting light having different wavelengths.

[6] The optical device described in [5], in which in a case where a length, over which the direction of the optical axis derived from the liquid crystal compound rotates 180° in one direction along which the direction of the optical axis derived from the liquid crystal compound changes while continuously rotating in the liquid crystal alignment pattern of the circularly polarized light-separating layer, is regarded as one period, the optical device has a plurality of kinds of circularly polarized light-separating layers whose lengths of the one period varies one another.

[7] The optical device described in [6], in which in the plurality of kinds of the circularly polarized light-separating layer, depending on a wavelength of an incidence ray, the longer the wavelength of the incidence ray incident on a portion, the longer the one period in the portion.

[8] The optical device described in any one of [1] to [7], in which the circularly polarized light-separating layer has an isotropic region in which no liquid crystal compound is aligned.

[9] The optical device described in [8], in which the isotropic region is provided in a region on which light from the light emitting portions of the organic electroluminescent substrate is not incident.

[10] The optical device described in any one of [1] to [9], further having a support, in which one surface of the support is provided with the circularly polarized light-separating layer and the other surface of the support is provided with a λ/4 plate and the polarizer.

According to the optical device of an embodiment of the present invention, in an optical device using organic EL, it is possible to accomplish both the effect of preventing external light reflection and the improvement of utilization efficiency of light emitted from an organic EL element.

DESCRIPTION OF THE PREFERRED EMBODIMENTS

Hereinafter, the optical device according to an embodiment of the present invention will be specifically described based on suitable examples illustrated in the attached drawings.

In the present specification, a range of numerical values described using "to" means a range including the numerical values described before and after "to" as a lower limit and an upper limit.

In the present specification, "(meth) acrylate" is used as a term meaning "either or both of acrylate and methacrylate".

In the present specification, visible light refers to light of a wavelength visible to the human eye among electromagnetic waves, which is light in a wavelength range of 380 to 780 nm. Invisible light refers to light in a wavelength range shorter than 380 nm and a wavelength range longer than 780 nm.

Furthermore, although there is no particular limitation, among visible lights, light in a wavelength range of 420 to 490 nm is blue light, light in a wavelength range of 495 to 570 nm is green light, and light in a wavelength range of 620 to 750 nm is red light.

In the present specification, Re (λ) represents in-plane retardation at a wavelength k. Unless otherwise specified, the wavelength λ is 550 nm.

In the present specification, Re (λ) is a value measured at a wavelength λ by using AxoScan (manufactured by Axometrics, Inc). By inputting an average refractive index ((nx+ny+nz)/3) and a film thickness (d (μm)) in AxoScan, a slow axis direction (°) and Re (λ)=R0 (λ) are calculated.

R0 (λ) is represented by a numerical value calculated by AxoScan, and means Re (k).

In the present specification, in a case where a minimum transmittance of an object (member) of interest is T min (%), a selective reflection center wavelength refers to the mean of two wavelengths showing a half transmittance T½ (%) represented by the following equation.

Equation for calculating half transmittance:
$T\frac{1}{2}=100-(100-T\min)\div 2$ The optical device according to an embodiment of the present invention is an optical device which is used in an organic EL display device, an organic EL lighting device, and the like and exploits light emission by organic EL. The optical device has an organic EL substrate having a non-light emitting portion having a metallic reflecting portion and light emitting portions by organic EL, a circularly polarized light-separating layer having a liquid crystal alignment pattern in which a liquid crystal compound is twisted and aligned along a helical axis extending in a thickness direction and a direction of an optical axis derived from the liquid crystal compound changes while continuously rotating in at least one direction in the plane, a λ/4 plate, and a polarizer.

According to such an optical device of the embodiment of the present invention, in an organic EL display device or the like, both the prevention of external light reflection and the improvement of utilization efficiency of light emitted by organic EL can accomplished.

Figure 1:
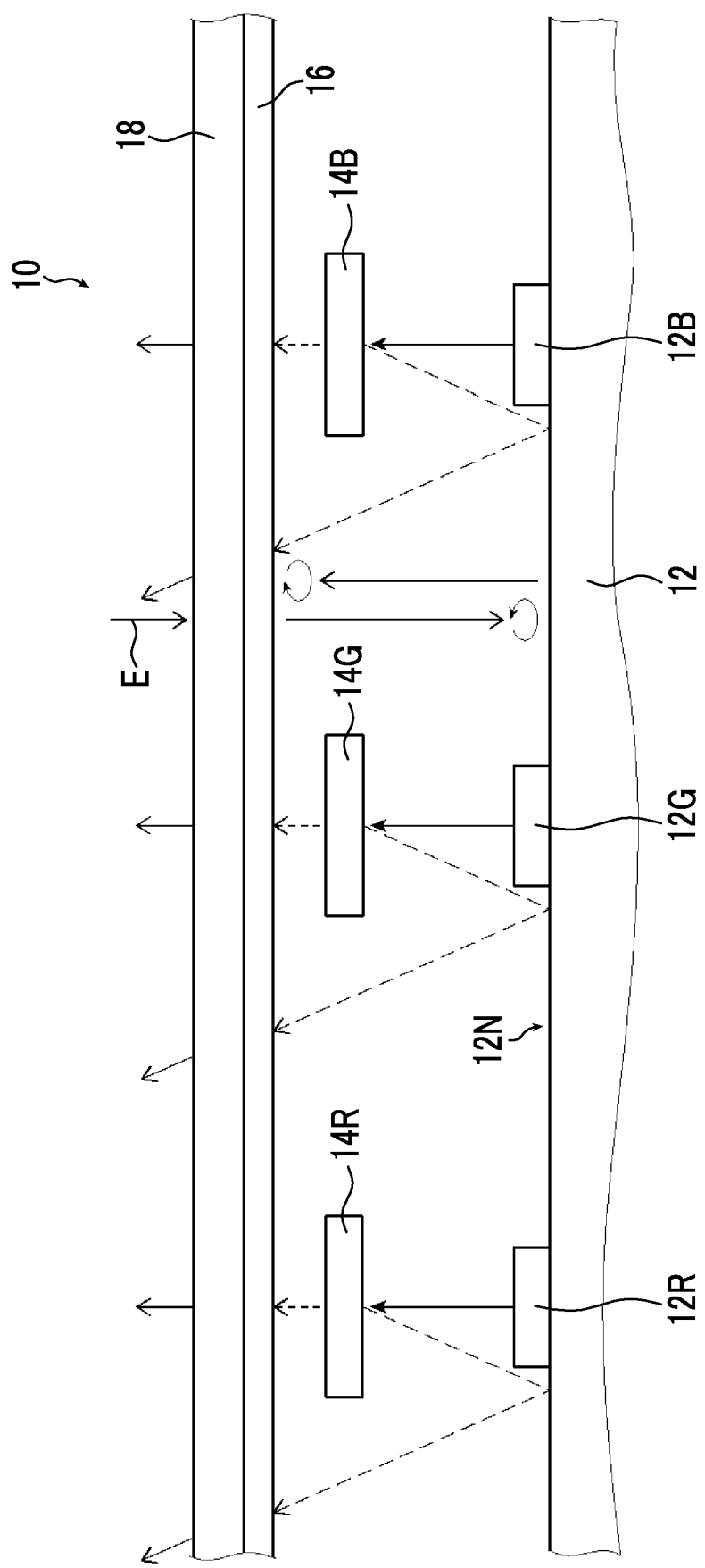
FIG. 1 is a conceptual view of an example of an optical device according to an embodiment of the present invention.

FIG. 1 is a conceptual view of an example of the optical device according to an embodiment of the present invention.

The optical device shown in FIG. 1 is an optical device used as an organic electro luminescence (EL) display device (organic EL display), an organic EL lighting device, and the like. The optical device has an organic EL substrate 12, an R circularly polarized light-separating member 14R, G circularly polarized light-separating member 14G, a B circularly polarized light-separating member 14B, a λ/4 plate 16, and a polarizer 18.

<Organic EL Substrate>

The organic EL substrate 12 is a known organic EL substrate (an organic EL panel or an organic EL light emitting element substrate) used in an organic EL display device or the like.

The optical device 10 illustrated in the drawing is for displaying full color images. The organic EL substrate 12 has an R light emitting portion 12R that emits red light by organic EL, a G light emitting portion 12G that emits green light by organic EL, and a B light emitting portion 12B that emits blue light by organic EL. In the following description, in a case where the R light emitting portion 12R, the G light emitting portion 12G, and the B light emitting portion 12B do not need to be distinguished from one another, the R light emitting portion 12R, the G light emitting portion 12G, and the B light emitting portion 12B will be collectively called "light emitting portion" as well.

In the organic EL substrate 12, a number of R light emitting portions 12R, G light emitting portions 12G, and B light emitting portions 12B described above are two-dimensionally arranged as in known organic EL substrates (see the mask shown in FIG. 11 which will be described later).

As described above, the organic EL substrate 12 is a known organic EL substrate. Therefore, the R light emitting portion 12R, the G light emitting portion 12G, and the B light emitting portion 12B are all known organic EL elements (an organic EL light emitting element, an organic EL light emitting portion, and an organic electroluminescent layer).

In the organic EL substrate 12, within the surface on which the R light emitting portion 12R, the G light emitting portion 12G, and the B light emitting portion 12B are formed, a region without the R light emitting portion 12R, the G light emitting portion 12G, and the B light emitting portion 12B is a non-light emitting portion 12N.

In the non-light emitting portion 12N, metal wiring, metal electrodes, and the like are formed as in known organic EL substrates. The metal wiring and the like are the metallic reflecting portion in the non-light emitting portion 12N.

In the optical device 10 illustrated in the drawing, the organic EL substrate 12 is a substrate for displaying full color images and the like that has the R light emitting portion 12R, the G light emitting portion 12G, and the B light emitting portion 12B. However, the present invention is not limited thereto.

For example, the organic EL substrate may be a substrate for displaying monochromic images that has only one of the R light emitting portion 12R, the G light emitting portion 12G, and the B light emitting portion 12B. Alternatively, the organic EL substrate may be a substrate for displaying dichromatic images and the like that has the R light emitting portion 12R and the G light emitting portion 12G, the R light emitting portion 12R and the B light emitting portion 12B, or the G light emitting portion 12G and the B light emitting portion 12B.

In a case where the display device of the present invention is for displaying monochromic image, dichromatic images, and the like, the display device is provided only with a circularly polarized light-separating member (circularly polarized light-separating region), which will be described later, for each color.

Examples of methods of causing light to be efficiently emitted to the front from each of the light emitting portions of the organic EL substrate include a method of shaping the organic EL substrate for collecting light, a method of using a microcavity, and the like. Examples of the method of shaping the organic EL substrate for collecting light include the method described in JP1988-314795A (JP-S63-314795A). Examples of the method of using a microcavity include the method described in JP2010-153284A.

<Circularly Polarized Light-Separating Member>

In the optical device 10, the R circularly polarized light-separating member 14R is disposed in a region which is above the R light emitting portion 12R and irradiated with red light from the R light emitting portion 12R. The R circularly polarized light-separating member 14R is disposed in a region which is above the G light emitting portion 12G and irradiated with green light from the G light emitting portion 12G. Furthermore, the B circularly polarized light-separating member 14B is disposed in a region which is above the B light emitting portion 12B and irradiated with blue light from the B light emitting portion 12B.

The R circularly polarized light-separating member 14R divides the non-polarized red light emitted from the R light emitting portion 12R into right-handed circularly polarized light and left-handed circularly polarized light by transmitting left-handed circularly polarized light (fine broken line) and reflecting right-handed circularly polarized light (thick broken line) obliquely to the left in the drawing relative to the direction of specular reflection.

The G circularly polarized light-separating member 14G divides the non-polarized green light emitted from the G light emitting portion 12G into right-handed circularly polarized light and left-handed circularly polarized light by transmitting left-handed circularly polarized light (fine broken line) and reflecting right-handed circularly polarized light (thick broken line) obliquely to the left in the drawing relative to the direction of specular reflection.

The B circularly polarized light-separating member 14B divides the non-polarized blue light emitted from the B light emitting portion 12B into right-handed circularly polarized light and left-handed circularly polarized light by transmitting left-handed circularly polarized light (fine broken line) and reflecting right-handed circularly polarized light (thick broken line) obliquely to the left in the drawing relative to the direction of specular reflection.

Figure 2:
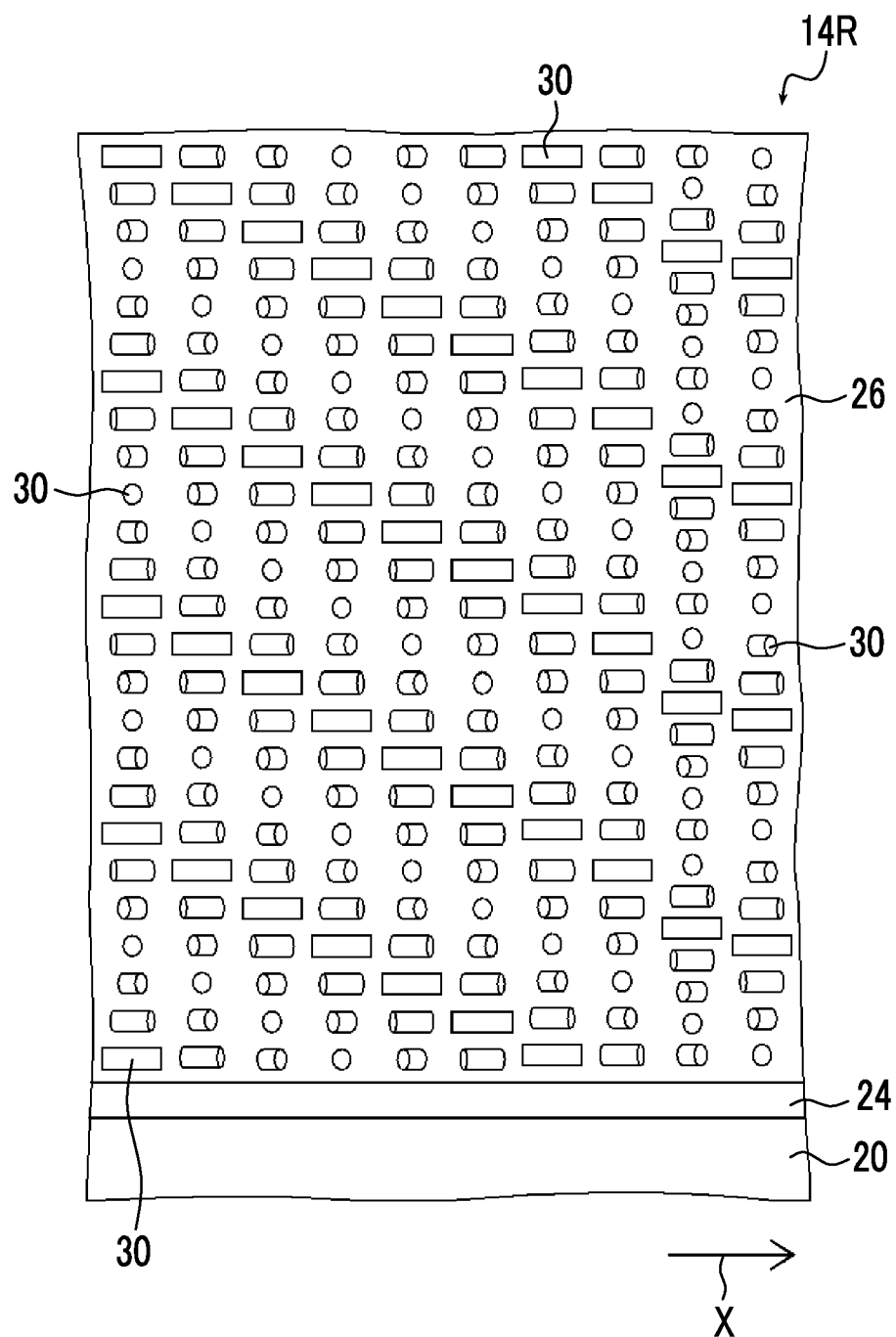
FIG. 2 is a conceptual view of a circularly polarized light-separating member of the optical device shown in FIG. 1.

FIG. 2 conceptually shows the R circularly polarized light-separating member 14R.

In the following section, the R circularly polarized light-separating member 14R will be described as a typical example. However, the G circularly polarized light-separating member 14G and the B circularly polarized light-separating member 14B basically have the same constitution.

The R circularly polarized light-separating member 14R has a support 20, an alignment film 24, and a circularly polarized light-separating layer 26. Therefore, the G circularly polarized light-separating member 14G and the B circularly polarized light-separating member 14B also have the same support 20, alignment film 24, and circularly polarized light-separating layer 26.

Furthermore, in the following description, in a case where the R circularly polarized light-separating member 14R, the G circularly polarized light-separating member 14G, and the B circularly polarized light-separating member 14B do not need to be distinguished from one another, the R circularly polarized light-separating member 14R, the G circularly polarized light-separating member 14G, and the B circularly polarized light-separating member 14B will be collectively called "circularly polarized light-separating member" as well.

The R circularly polarized light-separating member 14R, the G circularly polarized light-separating member 14G, and the B circularly polarized light-separating member 14B are arranged such that the side of the circularly polarized light-separating layer 26 faces the side of the organic EL substrate 12.

<<Support>>

In the R circularly polarized light-separating member 14R, the support 20 supports the alignment film 24 and the circularly polarized light-separating layer 26. The same is true of the G circularly polarized light-separating member 14G and the B circularly polarized light-separating member 14B.

Various sheet-like substances (films and plate-like substances) can be used as the support 20 as long as the substances can support the alignment film 24 and the circularly polarized light-separating layer 26.

As the support 20, a transparent support is preferable, and examples thereof include a polyacrylic resin film such as polymethylmethacrylate, a cellulose-based resin film such as cellulose triacetate, a cycloolefin polymer-based film, polyethylene terephthalate (PET), polycarbonate, polyvinyl chloride, and the like. The support is not limited to a flexible film, and may be a non-flexible substrate such as a glass substrate. As the cycloolefin polymer-based film, for example, it is possible to use commercially available products such as "ARTON (trade name)" manufactured by JSR Corporation and "ZEONOR (trade name)" manufactured by ZEON CORPORATION.

The thickness of the support 20 is not limited, and may be appropriately set according to the use of the optical device 10, the material forming the support 20, and the like such that the support 20 can support the alignment film 24 and the circularly polarized light-separating layer 26.

The thickness of the support 20 is preferably 1 to 1,000 µm, more preferably 3 to 250 µm, and even more preferably 5 to 150 µm.

<<Alignment Film>>

In the R circularly polarized light-separating member 14R, the alignment film 24 is formed on the surface of the support 20.

The alignment film 24 is used for aligning liquid crystal compounds 30 in a predetermined liquid crystal alignment pattern in forming the circularly polarized light-separating layer 26 of the R circularly polarized light-separating member 14R.

The point described above is the same for the G circularly polarized light-separating member 14G and the B circularly polarized light-separating member 14B.

As will be described later, in the optical device 10 according to the embodiment of the present invention, the circularly polarized light-separating layer 26 is formed using a composition including the liquid crystal compound 30 and has a liquid crystal alignment pattern in which the direction of an optical axis 30A (see FIG. 3) derived from the liquid crystal compound 30 changes while continuously rotating along one direction (an arrow X direction which will be described later) in the plane.

Accordingly, the alignment film 24 of each of the circularly polarized light-separating members is formed such that the circularly polarized light-separating layer 26 can form the liquid crystal alignment pattern.

In addition, in the optical device 10 according to the embodiment of the present invention, the liquid crystal compound 30 is twisted and aligned along a helical axis extending in a thickness direction.

In the present invention, a length, over which the direction of the optical axis 30A rotates 180° in one direction in which the direction of the optical axis 30A changes while continuously rotating in the liquid crystal alignment pattern of the circularly polarized light-separating layer 26, is regarded as one period (rotation period of the optical axis).

In a preferred aspect of the optical device 10 according to the embodiment of the present invention, the length of one period (one period A) varies among the circularly polarized light-separating layers 26 of the R circularly polarized light-separating member 14R, the G circularly polarized light-separating member 14G, and the B circularly polarized light-separating member 14B according to the wavelength of the corresponding light (color of light).

Specifically, regarding the length of one period in the liquid crystal alignment pattern of the circularly polarized light-separating layer 26, it is preferable that the longer the wavelength of the corresponding light handled by the layer 26, the longer the one period in the layer 26. That is, in the circularly polarized light-separating layer 26, the order of the sizes of wavelengths of the corresponding light preferably coincides with the order of the lengths of one period. Therefore, for the circularly polarized light-separating members, one period in the liquid crystal alignment pattern of the circularly polarized light-separating layer 26 is preferably the shortest in the B circularly polarized light-separating member 14B, the second shortest in the G circularly polarized light-separating member 14G, and the longest in the R circularly polarized light-separating member 14R.

The above points will be specifically described later.

Accordingly, the alignment film 24 has such an alignment pattern that the circularly polarized light-separating layers 26 of the circularly polarized light-separating members obtain a liquid crystal alignment pattern in which the order of sizes of wavelengths of the corresponding light coincides with the order of lengths of one period.

In the following description, "the direction of the optical axis 30A rotates" will be also simply described as "the optical axis 30A rotates".

As the alignment film 24, various known alignment films can be used.

Examples thereof include a rubbing treatment film made of an organic compound such as a polymer, an obliquely deposited film of an inorganic compound, a film having microgrooves, and a film obtained by layering Langmuir-Blodgett (LB) films prepared by the Langmuir-Blodgett method by using organic compounds such as ω-tricosanoic acid, dioctadecylmethylammonium chloride, and methyl stearate.

The alignment film 24 prepared by the rubbing treatment can be formed by rubbing several times the surface of a polymer layer with paper or cloth in a certain direction.

As materials used for the alignment film 24, for example, polyimide, polyvinyl alcohol, polymers having a polymerizable group described in JP1997-152509A (JP-H09-152509A), and the materials used for forming the alignment film 24 or the like described in JP2005-097377A, JP2005-099228A, and JP2005-128503A are preferred.

In the optical device 10 according to the embodiment of the present invention, as the alignment film 24, so-called photo alignment film is suitably used which is obtained by irradiating a photo-alignable material with polarized light or unpolarized light so as to obtain the alignment film 24. That is, in the optical device 10 according to the embodiment of the present invention, as the alignment film 24, an alignment film 24 is suitably used which is formed by coating the support 20 with a photo alignment material.

The irradiation of the alignment film 24 with polarized light can be performed in a vertical direction or an oblique direction. The irradiation of the alignment film 24 with unpolarized light can be performed in an oblique direction.

As the photo alignment material used for the alignment film 24 that can be used in the present invention, for example, the azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, the aromatic ester compounds described in JP2002-229039A, the maleimide and/or alkenyl-substituted nadiimide compounds having a photo-alignable unit described in JP2002-265541A and JP2002-317013A, the photo-crosslinkable silane derivatives described in JP4205195B and JP4205198B, the photo-crosslinkable polyimide, the photo-crosslinkable polyamide, and the photo-crosslinkable ester described in JP2003-520878A, JP2004-529220A, and JP4162850B, the photo-dimerizable compounds, particularly, the cinnamate compound, chalcone compound, and coumarin compound described in JP1997-118717A (JP-1109-118717A), JP1998-506420A (JP-H10-506420A), JP2003-505561A, WO2010/150748A, JP2013-177561A, and JP2014-012823A, and the like are preferable.

Among these, the azo compounds, photo-crosslinkable polyimide, the photo-crosslinkable polyamide, the photo-crosslinkable ester, the cinnamate compound, and the chalcone compound are suitably used.

The thickness of the alignment film 24 is not particularly limited, and may be appropriately set according to the material forming the alignment film 24 such that a necessary alignment function is obtained. The thickness of the alignment film 24 is preferably 0.01 to 5 µm, and more preferably 0.05 to 2 µm.

As methods of forming the alignment film 24, it is possible to use various known methods according to the material forming the alignment film 24 without particular limitation. Examples thereof include a method of coating the surface of the support 20 with the alignment film 24, drying the alignment film 24, and then exposing the alignment film 24 to a laser beam so as to form an alignment pattern.

Figure 5:
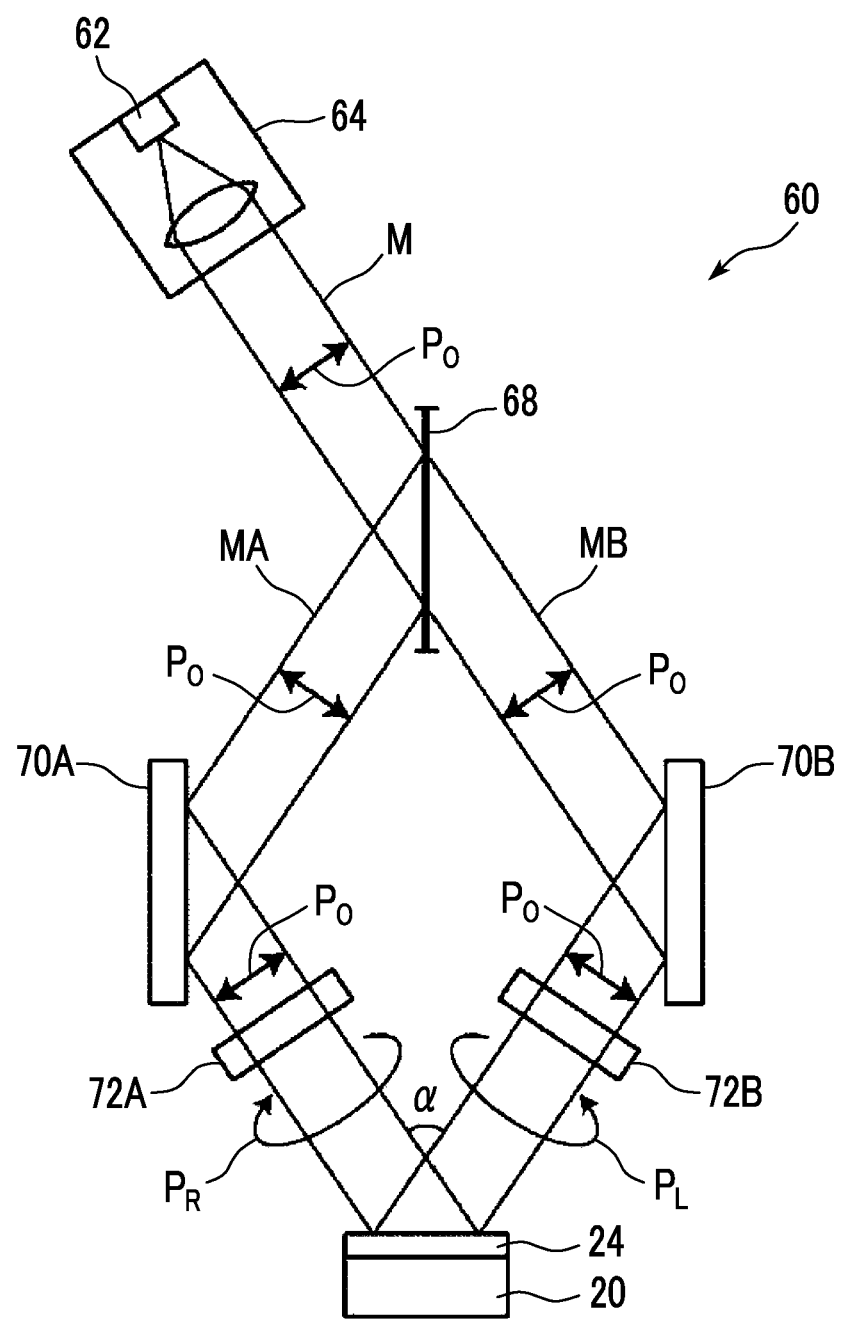
FIG. 5 is a conceptual view of an example of an exposure device that exposes an alignment film.

FIG. 5 conceptually shows an example of an exposure device that forms an alignment pattern by exposing the alignment film 24.

An exposure device 60 shown in FIG. 5 comprises a light source 64 comprising a laser 62, a beam splitter 68 that splits a laser beam M emitted from the laser 62 into two light rays MA and MB, mirrors 70A and 70B arranged on the optical paths of the two split light rays MA and MB respectively, and λ/4 plates 72A and 72B.

The light source 64 comprises a polarizer and emits linearly polarized light $P_0$ although the polarizer is not shown in the drawing. The λ/4 plates 72A and 72B comprise optical axes (slow axes) that are orthogonal to each other. The λ/4 plate 72A converts the linearly polarized light $P_0$ (light ray MA) into right-handed circularly polarized light $P_R$, and the λ/4 plate 72B converts the linearly polarized light $P_0$ (light ray MB) into left-handed circularly polarized light $P_L$.

The support 20 having the alignment film 24 on which an alignment pattern has not yet been formed is disposed on an exposure portion. The two light rays MA and MB are crossed on the alignment film 24 such that interference occurs, and the alignment film 24 is exposed by being irradiated with the interference light.

Due to the interference, the polarization state of the light radiated to the alignment film 24 periodically changes in the form of interference fringes. As a result, the alignment film 24 obtains an alignment pattern in which the alignment state periodically changes.

In the exposure device 60, by changing an intersecting angle α between the two light rays MA and MB, the period of the alignment pattern can be controlled. That is, in the exposure device 60, in a case where the intersecting angle α is controlled, in the alignment pattern in which the optical axis 30A derived from the liquid crystal compound 30 continuously rotates in one direction, the length of one period (one period A) in which the optical axis 30A rotates 180° in one direction along which the optical axis 30A rotates can be controlled.

By forming the circularly polarized light-separating layer 26 on the alignment film 24 having the alignment pattern in which the alignment state periodically changes, as will be described later, it is possible to form a circularly polarized light-separating layer 26 having a liquid crystal alignment pattern in which the optical axis 30A derived from the liquid crystal compound 30 continuously rotates in one direction.

Furthermore, by rotating 90° the optical axis of each of the λ/4 plates 72A and 72B, the rotation direction of the optical axis 30A can be reversed.

In the optical device according to the embodiment of the present invention, the alignment film 24 is provided as a preferred aspect and is not an essential constituent.

For example, an alignment pattern can be formed on the support 20 by a method of performing a rubbing treatment on the support 20, a method of processing the support 20 by using laser beams, or the like such that the circularly polarized light-separating layer 26 or the like has a constitution including a liquid crystal alignment pattern in which the direction of the optical axis 30A derived from the liquid crystal compound 30 changes while continuously rotating in at least one direction in the plane.

<<Circularly Polarized Light-Separating Layer>>

In the R circularly polarized light-separating member 14R, the circularly polarized light-separating layer 26 is formed on the surface of the alignment film 24. The same is true of the G circularly polarized light-separating member 14G and the B circularly polarized light-separating member 14B.

As described above, in the optical device 10 according to the embodiment of the present invention, the circularly polarized light-separating layer 26 is formed using a composition including a liquid crystal compound.

Furthermore, the circularly polarized light-separating layer 26 has a liquid crystal alignment pattern in which the liquid crystal compound 30 is twisted and aligned along a helical axis extending in a thickness direction and the direction of the optical axis 30A derived from the liquid crystal compound changes while continuously rotating along at least one direction in the plane. In the optical device 10 illustrated in the drawing, the circularly polarized light-separating layer 26 has a helical structure in which the helically revolving liquid crystal compounds 30 are stacked. The constitution of the stacked liquid crystal compounds 30 that helically rotate once (rotate 360°) is regarded as one pitch of a helix. The circularly polarized light-separating layer 26 has a structure in which the helically revolving liquid crystal compounds 30 are laminated at plural pitches.

That is, the circularly polarized light-separating layer 26 is a layer obtained by fixing a cholesteric liquid crystalline phase. In other words, the circularly polarized light-separating layer 26 is a layer consisting of the liquid crystal compound 30 (liquid crystal material) having a cholesteric structure. Hereinafter, the layer obtained by fixing a cholesteric liquid crystalline phase will be also called "cholesteric liquid crystal layer".

The cholesteric liquid crystal layer has wavelength-selective reflexibility.

The cholesteric liquid crystal layer constituting the circularly polarized light-separating layer 26 of the R circularly polarized light-separating member 14R reflects right-handed circularly polarized red light and transmits other lights. Therefore, the cholesteric liquid crystal layer has a selective reflection center wavelength in a wavelength range of red light. As described above, the red light emitted from the R light emitting portion 12R of the organic EL substrate 12 is incident on the R circularly polarized light-separating member 14R. Therefore, the circularly polarized light-separating layer 26 of the R circularly polarized light-separating member 14R reflects right-handed circularly polarized red light and transmits left-handed circularly polarized red light.

The cholesteric liquid crystal layer constituting the circularly polarized light-separating layer 26 of the G circularly polarized light-separating member 14G reflects right-handed circularly polarized green light and transmits other lights. Therefore, the cholesteric liquid crystal layer has a selective reflection center wavelength in a wavelength range of green light. As described above, the green light emitted from the G light emitting portion 12G of the organic EL substrate 12 is incident on the G circularly polarized light-separating member 14G. Therefore, the circularly polarized light-separating layer 26 of the G circularly polarized light-separating member 14G reflects right-handed circularly polarized green light and transmits left-handed circularly polarized green light.

The cholesteric liquid crystal layer constituting the circularly polarized light-separating layer 26 of the B circularly polarized light-separating member 14B reflects right-handed circularly polarized blue light and transmits other lights. Therefore, the cholesteric liquid crystal layer has a selective reflection center wavelength in a wavelength range of blue light. As described above, the blue light emitted from the B light emitting portion 12B of the organic EL substrate 12 is incident on the B circularly polarized light-separating member 14B. Therefore, the circularly polarized light-separating layer 26 of the B circularly polarized light-separating member 14B reflects only right-handed circularly polarized blue light and transmits left-handed circularly polarized blue light.

<<<<Cholesteric Liquid Crystalline Phase>>>>

The cholesteric liquid crystalline phase is known to exhibit selective reflexibility at a specific wavelength. The central wavelength λ of selective reflection (selective reflection center wavelength) depends on a pitch P (=helix period) of the helical structure in the cholesteric liquid crystalline phase, and satisfies the relationship of $\lambda = n \times P$ with an average refractive index n of the cholesteric liquid crystalline phase. Therefore, in a case where the pitch of the helical structure is adjusted, the selective reflection center wavelength can be adjusted. The pitch of the cholesteric liquid crystalline phase depends on the type of the chiral agent used together with the liquid crystal compound for forming the cholesteric liquid crystal layer or on the concentration of the chiral agent added. Therefore, by adjusting the type and concentration of the chiral agent, it is possible to obtain a desired pitch.

The adjustment of pitch is specifically described in a research report No. 50 (2005), p. 60-63 of FUJIFILM Corporation. For measuring the sense or pitch of a helix, it is possible to use the methods described in "Introduction to Experiment of Liquid Crystal Chemistry" (edited by The Japanese Liquid Crystal Society, Sigma Publication Ltd, 2007, p. 46) and "Handbook of Liquid Crystal" (Editorial Committee of Handbook of Liquid Crystal, MARUZEN Co., Ltd. p. 196).

The cholesteric liquid crystalline phase exhibits selective reflexibility to any of left-handed circularly polarized light or right-handed circularly polarized light at a specific wavelength. Whether the light to be reflected is right-handed circularly polarized light or left-handed circularly polarized light depends on the twisted direction (sense) of the helix of the cholesteric liquid crystalline phase. In a case where the cholesteric liquid crystalline phase is a right-handed helix, right-handed circularly polarized light is selectively reflected by the cholesteric liquid crystalline phase, and in a case where the cholesteric liquid crystalline phase is a left-handed helix, left-handed circularly polarized light is selectively reflected by the cholesteric liquid crystalline phase.

Therefore, in the optical device 10 illustrated in the drawing, the cholesteric liquid crystal layer constituting the circularly polarized light-separating layer 26 is a layer obtained by fixing a cholesteric liquid crystalline phase as a right-handed twist.

The sense of rotation of the cholesteric liquid crystalline phase can be adjusted by the type of the liquid crystal compound forming the cholesteric liquid crystal layer and/or the type of the chiral agent added.

A half-width Δλ (nm) of a selective reflection band (circularly polarized light reflection band) in which selective reflection occurs depends on Δn of the cholesteric liquid crystalline phase and the pitch P of the helix, and satisfies a relationship of $\Delta\lambda = \Delta n \times P$. Therefore, by controlling Δn, the width of the selective reflection band can be adjusted. Δn can be adjusted by the type of the liquid crystal compound forming the cholesteric liquid crystal layer, a mixing ratio thereof, and the temperature adopted for fixing the alignment.

The half-width of the reflection wavelength range is adjusted according to the use of the optical device 10. For example, the half-width may be 10 to 500 nm, and is preferably 20 to 300 nm and more preferably 30 to 100 nm.

<<<Method of Forming Cholesteric Liquid Crystal Layer>>>

The cholesteric liquid crystal layer, that is, the circularly polarized light-separating layer 26 of the R circularly polarized light-separating member 14R can be formed by fixing the cholesteric liquid crystalline phase in the form of a layer. The same is true of the G circularly polarized light-separating member 14G and the B circularly polarized light-separating member 14B.

The structure obtained by fixing the cholesteric liquid crystalline phase may be a structure in which the alignment of the liquid crystal compound having turned into the cholesteric liquid crystalline phase is maintained. Typically, the structure obtained by fixing the cholesteric liquid crystalline phase is preferably established by aligning a polymerizable liquid crystal compound in the form of a cholesteric liquid crystalline phase, polymerizing and curing the compound by means of ultraviolet irradiation, heating, and the like so as to form a layer without fluidity, and applying an external field or external force thereto so as to change the state of the layer without changing the alignment form.

The structure obtained by fixing the cholesteric liquid crystalline phase just needs to retain the optical properties of the cholesteric liquid crystalline phase, and the liquid crystal compound 30 does not need to exhibit liquid crystallinity in the cholesteric liquid crystal layer. For example, the polymerizable liquid crystal compound may lose liquid crystallinity by turning into a high-molecular-weight compound through a curing reaction.

One of the examples of materials used for forming the cholesteric liquid crystal layer obtained by fixing the cholesteric liquid crystalline phase includes a liquid crystal composition including a liquid crystal compound. The liquid crystal compound is preferably a polymerizable liquid crystal compound.

Furthermore, the liquid crystal composition used for forming the cholesteric liquid crystal layer may further include a surfactant and a chiral agent.

—Polymerizable Liquid Crystal Compound—

The polymerizable liquid crystal compound may be a rod-like liquid crystal compound or a disk-like liquid crystal compound.

As the rod-like polymerizable liquid crystal compound forming the cholesteric liquid crystalline phase, a rod-like nematic liquid crystal compound is preferable. As the rod-like nematic liquid crystal compound, azomethines, azoxys, cyanobiphenyls, cyanophenyl esters, benzoic acid esters, cyclohexanecarboxylic acid phenyl esters, cyanophenylcyclohexanes, cyano-substituted phenylpyrimidines, alkoxy-substituted phenylpyrimidines, phenyldioxanes, tolans, alkenylcyclohexylbenzonitriles, and the like are preferably used. Not only low-molecular-weight liquid crystal compounds, but also high-molecular-weight liquid crystal compounds can be used.

The polymerizable liquid crystal compound can be obtained by introducing a polymerizable group into a liquid crystal compound. Examples of the polymerizable group include an unsaturated polymerizable group, an epoxy group, and an aziridinyl group. Among these, an unsaturated polymerizable group is preferable, and an ethylenically unsaturated polymerizable group is more preferable. The polymerizable group can be introduced into a molecule of a liquid crystal compound by various methods. The number of polymerizable groups included in the polymerizable liquid crystal compound is preferably 1 to 6, and more preferably 1 to 3.

Examples of the polymerizable liquid crystal compound include the compounds described in Makromol. Chem., vol. 190, p. 2255 (1989), Advanced Materials, vol. 5, p. 107 (1993), U.S. Pat. Nos. 4,683,327A, 5,622,648A, 5,770,107A, WO95/022586A, WO95/024455A, WO97/000600A, WO98/023580A, WO98/052905A, JP1989-272551A (JP-H01-272551A), JP1994-016616A (JP-H06-016616A), JP1995-110469A (JP-H07-110469A), JP1999-080081A (JP-H11-080081A), JP2001-328973A, and the like. Two or more kinds of polymerizable liquid crystal compounds may be used in combination. In a case where two or more kinds of polymerizable liquid crystal compounds are used in combination, the alignment temperature can be reduced.

Furthermore, as polymerizable liquid crystal compounds other than those described above, it is possible to use the cyclic organopolysiloxane compound having a cholesteric phase as disclosed in JP1982-165480A (JP-S57-165480A), and the like. In addition, as the aforementioned high-molecular-weight liquid crystal compound, it is possible to use a polymer having a mesogenic group exhibiting liquid crystal properties that is introduced into either or both of a main chain and a side chain of the polymer, a high-molecular-weight cholesteric liquid crystal having a cholesteryl group introduced into a side chain of the liquid crystal, the liquid crystal polymer disclosed in JP1997-133810A (JP-H09-133810A), the liquid crystal polymer disclosed in JP1999-293252A (JP-H11-293252A), and the like.

—Disk-Like Liquid Crystal Compound—

As the disk-like liquid crystal compound for example, those described in JP2007-108732A, and JP2010-244038A, and the like can be preferably used.

The amount of the polymerizable liquid crystal compound added to the liquid crystal composition based on the mass of solid contents (except for solvents) of the liquid crystal composition is preferably 75% to 99.9% by mass, more preferably 80% to 99% by mass, and even more preferably 85% to 90% by mass.

—Surfactant—

The liquid crystal composition used for forming the cholesteric liquid crystal layer may contain a surfactant.

As the surfactant, a compound is preferable which can function as an alignment control agent making a contribution to the stable and rapid formation of a cholesteric liquid crystalline phase in a planar alignment. Examples of the surfactant include a silicone-based surfactant and a fluorine-based surfactant. Among these, for example, a fluorine-based surfactant is preferable.

Specifically, examples of the surfactant include the compounds described in paragraphs "0082" to "0090" of JP2014-119605A, the compounds described in paragraphs "0031" to "0034" of JP2012-203237A, the compounds exemplified in paragraphs "0092" and "0093" of JP2005-099248A, the compound exemplified in paragraphs "0076" to "0078" and paragraphs "0082" to "0085" of JP2002-129162A, the fluorine (meth)acrylate-based polymers described in paragraphs "0018" to "0043" of JP2007-272185A, and the like.

One kind of surfactant may be used singly, or two or more kinds of surfactants may be used in combination.

As the fluorine-based surfactant, the compounds described in paragraphs "0082" to "0090" of JP2014-119605A are preferable.

The amount of the surfactant added to the liquid crystal composition with respect to the total mass of the liquid crystal compound is preferably 0.01% to 10% by mass, more preferably 0.01% to 5% by mass, and even more preferably 0.02% to 1% by mass.

—Chiral Agent (Optically Active Compound)—

The chiral agent has a function of inducing the helical structure of the cholesteric liquid crystalline phase. Because the twisted direction or the helical pitch of the induced helix varies with the compound, the chiral agent may be selected according to the purpose.

The chiral agent is not particularly limited, and it is possible to use known compounds (for example, those described in Chapter 3, 4-3. <Chiral agents for twisted nematic (TN) and super twisted nematic (STN)> in Handbook of Liquid Crystal Device, edited by the $142^{nd}$ committee of Japan Society for The Promotion of Science, p. 199, 1989), isosorbide, isomannide derivatives, and the like.

Generally, the chiral agent includes asymmetric carbon atoms. However, an axially asymmetric compound or a planarly asymmetric compound that does not include asymmetric carbon atoms can also be used as the chiral agent. Examples of the axially asymmetric compound and the planarly asymmetric compound include binaphthyl, helicene, paracyclophane, and derivatives of these. The chiral agent may have a polymerizable group. In a case where both the chiral agent and liquid crystal compound have a polymerizable group, by a polymerization reaction between the polymerizable chiral agent and the polymerizable liquid crystal compound, it is possible to form a polymer having a repeating unit derived from the polymerizable liquid crystal compound and a repeating unit derived from the chiral agent. In this aspect, the polymerizable group included in the polymerizable chiral agent is preferably the same type of group as the polymerizable group included in the polymerizable liquid crystal compound. Accordingly, the polymerizable group of the chiral agent is also preferably an unsaturated polymerizable group, an epoxy group, or an aziridinyl group, more preferably an unsaturated polymerizable group, and even more preferably an ethylenically unsaturated polymerizable group.

Furthermore, the chiral agent may be a liquid crystal compound.

It is preferable that the chiral agent has a photoisomerizing group because then a pattern of a desired reflection wavelength corresponding to an emission wavelength can be formed by irradiating the liquid crystal composition with actinic rays or the like through a photomask after coating and alignment. As the photoisomerizing group, an isomerizing moiety of a compound exhibiting photochromic properties, an azo group, an azoxy group, and a cinnamoyl group are preferable. Specifically, it is possible to use the compounds described in JP2002-080478A, JP2002-080851A, JP2002-179668A, JP2002-179669A, JP2002-179670A, JP2002-179681A, JP2002-179682A, JP2002-338575A, JP2002-338668A, JP2003-313189A, JP2003-313292A, and the like.

The content of the chiral agent in the liquid crystal composition with respect to the molar amount of the liquid crystal compound contained in the composition is preferably 0.01 to 200 mol %, and more preferably 1 to 30 mol %.

—Polymerization Initiator—

In a case where the liquid crystal composition includes a polymerizable compound, it is preferable that the composition contains a polymerization initiator. In an aspect in which a polymerization reaction is caused by ultraviolet irradiation, as the polymerization initiator, it is preferable to use a photopolymerization initiator that can initiate the polymerization reaction by ultraviolet irradiation.

Examples of the photopolymerization initiator include an α-carbonyl compound (described in U.S. Pat. Nos. 2,367,661A and 2,367,670A), an acyloin ether (described in U.S. Pat. No. 2,448,828A), an α-hydrocarbon-substituted aromatic acyloin compound (described in U.S. Pat. No. 2,722,512A), a polynuclear quinone compound (described in U.S. Pat. Nos. 3,046,127A and 2,951,758A), a combination of triarylimidazole dimer and p-aminophenylketone (described in U.S. Pat. No. 3,549,367A), acrydine and phenazine compounds (described in JP1985-105667A (JP-S60-105667A) and U.S. Pat. No. 4,239,850A), an oxadiazole compound (described in U.S. Pat. No. 4,212,970A), and the like.

The content of the photopolymerization initiator in the liquid crystal composition with respect to the content of the liquid crystal compound is preferably 0.1% to 20% by mass, and more preferably 0.5% to 12% by mass.

—Crosslinking Agent—

For the purpose of improving film hardness after curing and improving durability, the liquid crystal composition may optionally contain a crosslinking agent. As the crosslinking agent, those cured by ultraviolet, heat, moisture, or the like can be suitably used.

The crosslinking agent is not particularly limited and can be appropriately selected according to the purpose. Examples of the crosslinking agent include a polyfunctional acrylate compound such as trimethylolpropane tri(meth) acrylate and pentaerythritol tri(meth)acrylate; an epoxy compound such as glycidyl (meth)acrylate and ethylene glycol diglycidyl ether; an aziridine compound such as 2,2-bishydroxymethylbutanol-tris[3-(1-aziridinyl)propionate] and 4,4-bis(ethyleneiminocarbonylamino)diphenylmethane; an isocyanate compound such as hexamethylene diisocyanate and biuret-type isocyanate; a polyoxazoline compound having an oxazoline group on a side chain; an alkoxysilane compound such as vinyltrimethoxysilane and N-(2-aminoethyl)3-aminopropyl trimethoxysilane; and the like. Furthermore, depending on the reactivity of the crosslinking agent, a known catalyst can be used. In a case where the catalyst is used, it is possible to improve the productivity in addition to the film hardness and durability. One kind of crosslinking agent may be used singly, or two or more kinds of crosslinking agents may be used in combination.

The content of the crosslinking agent with respect to the mass of solid contents in the liquid crystal composition is preferably 3% by mass to 20% by mass, and more preferably 5% by mass to 15% by mass. In a case where the content of the crosslinking agent is within the above range, a crosslinking density improving effect is easily obtained, and the stability of the cholesteric liquid crystalline phase can be further improved.

—Other Additives—

Furthermore, as long as the optical performance and the like do not deteriorate, a polymerization inhibitor, an antioxidant, an ultraviolet absorber, a light stabilizer, a coloring material, metal oxide fine particles, and the like can be optionally added to the liquid crystal composition.

In the process of forming the cholesteric liquid crystal layer, that is, the circularly polarized light-separating layer 26 of the R circularly polarized light-separating member 14R, It is preferable that the liquid crystal composition is used as a liquid. The same is true of the G circularly polarized light-separating member 14G and the B circularly polarized light-separating member 14B.

The liquid crystal composition may include a solvent. The solvent is not particularly limited and can be appropriately selected according to the purpose. As the solvent, an organic solvent is preferable.

The organic solvent is not limited, and can be appropriately selected according to the purpose. Examples thereof include ketones, alkyl halides, amides, sulfoxides, heterocyclic compounds, hydrocarbons, esters, ethers, and the like. One kind of crosslinking agent may be used singly, or two or more kinds of crosslinking agents may be used in combination. Considering the environmental load, ketones are preferable among the above.

In the process of forming the cholesteric liquid crystal layer, it is preferable to coat a surface for forming the cholesteric liquid crystal layer with the liquid crystal composition, align the liquid crystal compound in a state of cholesteric liquid crystalline phase, and then cure the liquid crystal compound so as to form the cholesteric liquid crystal layer.

That is, in a case where the cholesteric liquid crystal layer is formed on an alignment film, it is preferable to coat the alignment film with the liquid crystal composition, align the liquid crystal compound in a state of cholesteric liquid crystalline phase, and then cure the liquid crystal compound so as to form the cholesteric liquid crystal layer obtained by fixing the cholesteric liquid crystalline phase.

For coating the alignment film with the liquid crystal composition, it is possible to use known methods enabling a sheet-like substance to be uniformly coated with a liquid, such as a printing method like ink jet printing and scroll printing, spin coating, bar coating, and spray coating.

After coating, the liquid crystal composition is optionally dried and/or heated and then cured to form the cholesteric liquid crystal layer. In the step of drying and/or heating, the liquid crystal compound in the liquid crystal composition may be aligned as a cholesteric liquid crystalline phase. In a case where the liquid crystal composition is heated, the heating temperature is preferably equal to or lower than 200° C., and more preferably equal to or lower than 130° C.

The aligned liquid crystal compound is optionally further subjected to polymerization. The polymerization may be either thermal polymerization or photopolymerization by light irradiation, but is preferably photopolymerization. It is preferable to use ultraviolet for the light irradiation. The irradiation energy is preferably 20 mJ/cm$^2$ to 50 J/cm$^2$, and more preferably 50 to 1,500 mJ/cm$^2$. In order to accelerate the photopolymerization reaction, the light irradiation may be performed under heating conditions or in a nitrogen atmosphere. The wavelength of the ultraviolet for irradiation is preferably 250 to 430 nm.

The thickness of the cholesteric liquid crystal layer is not limited, and may be appropriately set according to the use of the optical device 10, the reflectance of light required to the cholesteric liquid crystal layer, the material forming the cholesteric liquid crystal layer, and the like such that the necessary reflectance of light is obtained.

<<<Liquid Crystal Alignment Pattern of Cholesteric Liquid Crystal Layer>>>

As described above, in the optical device 10 according to the embodiment of the present invention, the cholesteric liquid crystal layer, that is, the circularly polarized light-separating layer 26 of each of the R circularly polarized light-separating member 14R, the G circularly polarized light-separating member 14G, and the B circularly polarized light-separating member 14B has a liquid crystal alignment pattern in which the direction of the optical axis 30A derived from the liquid crystal compound 30 forming the cholesteric liquid crystalline phase changes while continuously rotating in one direction in the plane of the cholesteric liquid crystal layer (circularly polarized light-separating layer 26).

The optical axis 30A derived from the liquid crystal compound 30 is an axis on which a refractive index is the highest in the liquid crystal compound 30, which is so-called slow axis. For example, in a case where the liquid crystal compound 30 is a rod-shaped liquid crystal compound, the optical axis 30A extends in the longitudinal direction of the rod shape. Hereinafter, the optical axis 30A derived from the liquid crystal compound 30 will be also described as "optical axis 30A of the liquid crystal compound 30" or "optical axis 30A".

Figure 3:
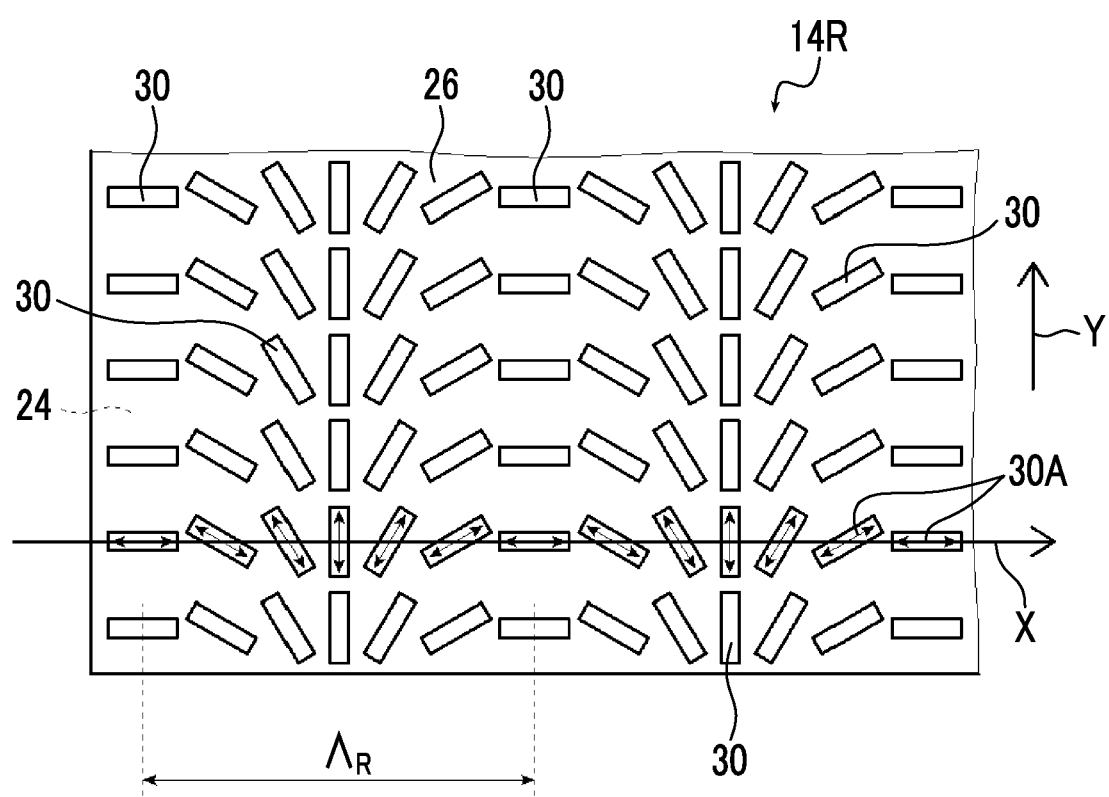
FIG. 3 is a plan view conceptually showing the circularly polarized light-separating layer of the optical device shown in FIG. 1.

FIG. 3 is a plan view conceptually showing the circularly polarized light-separating layer 26 of the R circularly polarized light-separating member 14R.

The plan view is a view of the optical device 10 in FIG. 1 that is seen from above. That is, in the plan view, the optical device 10 is seen in a thickness direction (=direction along which the respective layers (films) are laminated).

Furthermore, in FIG. 3, in order to clearly show the constitution of the optical device 10 according to the embodiment of the present invention, the liquid crystal compound 30 is illustrated as being located only within the surface of the alignment film 24.

In FIG. 3, the circularly polarized light-separating layer 26 of the R circularly polarized light-separating member 14R is described as a typical example. However, the circularly polarized light-separating layer 26 of the G circularly polarized light-separating member 14G and the circularly polarized light-separating layer 26 of the B circularly polarized light-separating member 14B basically have the same constitution and action as those of the circularly polarized light-separating layer 26 of the R circularly polarized light-separating member 14R, except that the wavelength range of the selectively reflected light, that is, the pitch at which the liquid crystal compound 30 helically rotates 360° and the length A of one period of the liquid crystal alignment pattern vary among the circularly polarized light-separating layers 26 of the above members.

As shown in FIG. 3, within the surface of the alignment film 24, the liquid crystal compound 30 constituting the circularly polarized light-separating layer 26 (cholesteric liquid crystal layer) is two dimensionally arranged in a predetermined direction indicated by an arrow X and a direction orthogonal to the direction (arrow X direction) according to the alignment pattern formed on the alignment film 24 as the underlayer.

Hereinafter, the direction orthogonal to the arrow X direction will be described as Y direction for convenience. That is, In FIGS. 1 and 2 and FIG. 4 which will be described later, the Y direction is a direction orthogonal to the surface of paper.

The liquid crystal compound 30 forming the circularly polarized light-separating layer 26 has a liquid crystal alignment pattern in which the direction of the optical axis 30A changes while continuously rotating along the arrow X direction in the plane of the circularly polarized light-separating layer 26. In the drawing, a liquid crystal alignment pattern is illustrated in which the optical axis 30A of the liquid crystal compound 30 change while continuously rotating clockwise along the arrow X direction (a predetermined direction).

Specifically, "direction of the optical axis 30A of the liquid crystal compound 30 changes while continuously rotating in the arrow X direction means that the angle formed between the optical axis 30A of the liquid crystal compounds 30 arranged along the arrow X direction and the arrow X direction changes with the position of the arrow X direction, and the angle formed between the optical axis 30A and the arrow X direction sequentially changes from θ to θ+180° or θ−180° along the arrow X direction.

The difference between the angles of the optical axes 30A of the liquid crystal compounds 30 adjacent to each other in the arrow X direction is preferably equal to or smaller than 45°, more preferably equal to or smaller than 15°, and even more preferably a smaller angle.

The liquid crystal compounds 30 forming the circularly polarized light-separating layer 26 are provided such that in the Y direction orthogonal to the arrow X direction, that is, in the Y direction orthogonal to one direction along which the optical axes 30A continuously rotate, the optical axes 30A are in the same direction.

In other words, the liquid crystal compounds 30 forming the circularly polarized light-separating layer 26 are arranged such that the optical axis 30A of the liquid crystal compounds 30 and the arrow X direction form the same angle in the Y direction.

Figure 4:
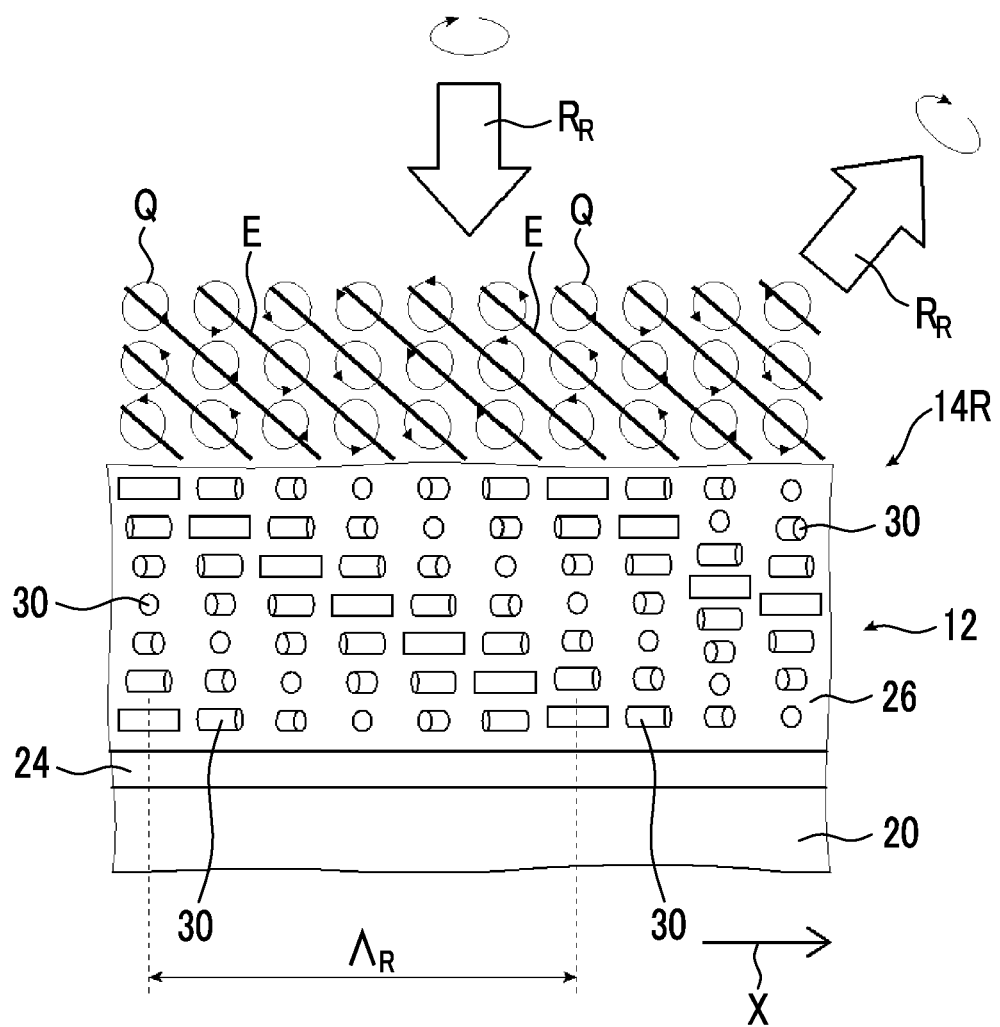
FIG. 4 is a conceptual view showing an action of the circularly polarized light-separating layer of the optical device shown in FIG. 1.

In the optical device 10 according to the embodiment of the present invention, a length (distance), over which the optical axis 30A of the liquid crystal compound 30 rotates 180° in the arrow X direction along which the optical axis 30A changes while continuously rotating in the plane of the liquid crystal alignment pattern of such a liquid crystal compound 30, is regarded as a length Λ of one period in the liquid crystal alignment pattern. In FIG. 3 and FIG. 4 which will be described later, the circularly polarized light-separating layer 26 of the R circularly polarized light-separating member 14R is illustrated for example. Therefore, the length of one period will be described as "$\Lambda_R$".

That is, a center-to-center distance between two liquid crystal compounds 30 in the arrow X direction that form the same angle with the arrow X direction is regarded as the length Λ of one period. Specifically, as shown in FIG. 3, a center-to-center distance between two liquid crystal compounds 30 in the arrow X direction in which the arrow X direction coincides with the direction of the optical axis 30A is regarded as the length Λ of one period. Hereinafter, the length Λ of one period will be also described as "one period Λ".

In the optical device 10 according to the embodiment of the present invention, the one period Λ in the liquid crystal alignment pattern of the cholesteric liquid crystal layer (circularly polarized light-separating layer 26) repeats in the arrow X direction, that is, in one direction along which the direction of the optical axis 30A continuously rotates and changes.

Generally, the cholesteric liquid crystal layer obtained by fixing the cholesteric liquid crystalline phase reflects the incidence ray (circularly polarized light) by specular reflection.

On the other hand, the cholesteric liquid crystal layer constituting the circularly polarized light-separating layer 26 reflects the incidence ray in a direction that is different from the direction of specular reflection (incidence direction) and forms an angle with the arrow X direction. Hereinafter, this point will be described with reference to FIG. 4.

As described above, the circularly polarized light-separating layer 26 of the R circularly polarized light-separating member 14R is a cholesteric liquid crystal layer selectively reflecting right-handed circularly polarized red light $R_R$.

Accordingly, in a case where light is incident on the R circularly polarized light-separating member 14R, the circularly polarized light-separating layer 26 of the R circularly polarized light-separating member 14R reflects only the right-handed circularly polarized red light $R_R$. and transmits other lights.

While being reflected from the circularly polarized light-separating layer 26, the absolute phase of the right-handed circularly polarized red light $R_R$ incident on the circularly polarized light-separating layer 26 of the R circularly polarized light-separating member 14R changes according to the direction of the optical axis 30A of each of the liquid crystal compounds 30.

In the circularly polarized light-separating layer 26 shown in the drawing, the optical axis 30A of the liquid crystal compound 30 changes while rotating in the arrow X direction (one direction). Therefore, the amount of change in the absolute phase of the incident right-handed circularly polarized red light $R_R$ varies with the direction of the optical axis 30A.

Furthermore, the liquid crystal alignment pattern formed on the circularly polarized light-separating layer 26 is a pattern showing periodicity in the arrow X direction. Therefore, the right-handed circularly polarized red light $R_R$ incident on the circularly polarized light-separating layer 26 obtains an absolute phase Q showing periodicity in the arrow X direction according to the direction of each of the optical axes 30A as being conceptually shown in FIG. 4.

In the array of the liquid crystal compound 30 along the Y direction orthogonal to the arrow X direction, the directions of the optical axes 30A of the liquid crystal compounds 30 relative to the arrow X direction are uniform.

As a result, in the circularly polarized light-separating layer 26, for the right-handed circularly polarized red light $R_R$, an equiphase plane E is formed which is inclined to the arrow X direction relative to the XY plane.

Accordingly, the right-handed circularly polarized red light $R_R$ incident on the circularly polarized light-separating layer 26 in the normal direction is reflected not in the direction of specular reflection but in the normal direction of the equiphase plane E. Consequently, the reflected right-handed circularly polarized red light $R_R$ is reflected in a direction inclined to the arrow X direction relative to the XY plane. The XY plane is the main surface of the circularly polarized light-separating layer, that is, the cholesteric liquid crystal layer.

The circularly polarized light-separating layer 26 (cholesteric liquid crystal layer) can reverse the refraction direction of the transmitted light by reversing the rotation direction of the optical axis 30A of the liquid crystal compound 30 that rotates along the arrow X direction.

Herein, the angle of reflection of light by the cholesteric liquid crystal layer, in which the optical axis 30A of the liquid crystal compound 30 continuously rotates in one direction (the arrow X direction), varies with the wavelength of the reflected light. Specifically, the longer the wavelength of the light, the greater the difference between the angle of incidence of the light and the angle of reflection of the light.

Therefore, in a case where red light, green light, and blue light are reflected as in the optical device 10 shown in FIG. 1, the angle of reflection varies among the red light, the green light, and the blue light. Specifically, in a case where one period Λ is uniform in the liquid crystal alignment pattern, and the selective reflection center wavelength of the cholesteric liquid crystal layer is compared for red, green, and blue, the difference between the angle of incidence of the light and the angle of reflection of the light is the greatest for the red light, second greatest for the green light, and the smallest for the blue light.

In contrast, the angle of reflection of light by the cholesteric liquid crystal layer having a liquid crystal alignment pattern, in which the optical axis 30A of the liquid crystal compound 30 continuously rotates in the arrow X direction (one direction), varies with the length A of one period, that is, one period A of the liquid crystal alignment pattern in which the optical axis 30A rotates 180° in the arrow X direction. Specifically, the shorter the one period A, the greater the difference between the angle of incidence of light and the angle of reflection of light.

Therefore, in a case where one period A of the liquid crystal alignment pattern in the circularly polarized light-separating layer 26 is adjusted according to the wavelength of the incidence ray, the angle of reflection of the right-handed circularly polarized light separated by the circularly polarized light-separating layer 26 (each of the circularly polarized light-separating members) can be adjusted, and the right-handed circularly polarized light can be emitted in the same direction.

Specifically, in the liquid crystal alignment pattern of the circularly polarized light-separating layer 26 (cholesteric liquid crystal layer), it is preferable that the longer the wavelength of light to be handled, the longer the one period A according to the color of the corresponding light. In other words, it is preferable that the longer the selective reflection center wavelength of the cholesteric liquid crystal layer, the longer the one period A in the liquid crystal alignment pattern of the circularly polarized light-separating layer 26.

Therefore, in each the circularly polarized light-separating members, the one period A in the liquid crystal alignment pattern of the circularly polarized light-separating layer 26 is preferably the longest for the R circularly polarized light-separating member 14R, the second longest for the G circularly polarized light-separating member 14G, and the shortest for the B circularly polarized light-separating member 14B. That is, the length of one period A in the liquid crystal alignment pattern of the circularly polarized light-separating layer 26 constituting each of the circularly polarized light-separating members preferably satisfies "R circularly polarized light-separating member 14R>G circularly polarized light-separating member 14G>B circularly polarized light-separating member 14B".

In other words, the order of sizes of wavelengths of the light handled by the R circularly polarized light-separating member 14R, the G circularly polarized light-separating member 14G, and the B circularly polarized light-separating member 14B, that is, the order of sizes of selective reflection center wavelengths of the cholesteric liquid crystal layer forming the circularly polarized light-separating layer 26 preferably coincides with the order of lengths of one period Λ in the liquid crystal alignment pattern of the circularly polarized light-separating layer 26.

In a case where the members are constituted as above, the circularly polarized lights can be emitted from the R circularly polarized light-separating member 14R, the G circularly polarized light-separating member 14G, and the B circularly polarized light-separating member 14B at the same angle, and the circularly polarized lights of the respective colors can be accurately incident on the λ/4 plate 16. As a result, the light use efficiency, which will be described later, can be further improved, and high-quality images can be displayed.

Furthermore, because the optical device 10 according to the embodiment of the present invention reflects light by using the cholesteric liquid crystal layer, by adjusting one period Λ in the liquid crystal alignment pattern, the angle of reflection of light can also be extremely freely controlled.

The points described so far are the same for a circularly polarized light-separating layer 52 of an R circularly polarized light-separating member 50R shown in FIGS. 9 and 10 which will be described later.

In the optical device 10 according to the embodiment of the present invention, one period A in the circularly polarized light-separating layer 26, that is, the alignment pattern of the cholesteric liquid crystal layer of each of the circularly polarized light-separating members is not limited and may be appropriately set according to the use of the optical device 10, the size of the optical device 10, and the like.

<λ/4 Plate>

The λ/4 plate 16 that converts the circularly polarized light, which is separated by the circularly polarized light-separating layer 26 of each of the circularly polarized light-separating members, into linearly polarized light. The circularly polarized light-separating members are the R circularly polarized light-separating member 14R, the G circularly polarized light-separating member 14G, and the B circularly polarized light-separating member 14B.

In the optical device 10 according to the embodiment of the present invention, the λ/4 plate 16 has a slow axis forming an angle of −45° with the transmission axis of the polarizer 18 which will be described later. In this example, in a case where the patterned retardation layer 16 is observed from the side of the polarizer 18, based on the transmission axis of the polarizer 18, the clockwise direction is represented by "+", and the counterclockwise direction is represented by "−".

The λ/4 plate is a retardation plate having a function of converting circularly polarized light having a specific wavelength into linearly polarized light or converting linearly polarized light into circularly polarized light.

More specifically, the λ/4 plate is a retardation plate in which a value of in-plane retardation at a predetermined wavelength λ nm is represented by Re $(\lambda)=\lambda/4$ (or an odd multiple thereof). This equation may be satisfied at any wavelength in the visible light region. The wavelength is, for example, 550 nm.

In a case where the λ/4 plate 16 is supported, for example, by the same support as the support 20 described above, the λ/4 plate 16 as a λ/4 plate means that both the λ/4 plate 16 and the support 20 function as the λ/4 plate in combination.

In each region of the λ/4 plate 16, the in-plane retardation at a wavelength of 550 nm, which is represented by Re $(550)=\Delta n_{550} \times d$, is preferably 115 to 165 nm, more preferably 120 to 150 nm, and even more preferably 125 to 145 nm.

The λ/4 plate 16 has a slow axis forming an angle of −45° with the transmission axis of the polarizer 18.

Therefore, the λ/4 plate 16 converts the left-handed circularly polarized light incident thereon into linearly polarized light in the same direction as the transmission axis of the polarizer 18.

It is preferable to form the λ/4 plate 16 by using a liquid crystal compound.

Examples of the method of forming the λ/4 plate 16 include a method of fixing a liquid crystal compound in an aligned state. As the liquid crystal compound, it is possible to use those exemplified above regarding the formation of the circularly polarized light-separating layer 26.

In order to keep the in-plane retardation of the λ/4 plate 16 within the above range, sometimes the alignment state of the liquid crystal compound is controlled. At this time, in a case where a rod-like liquid crystal compound is used, it is preferable to fix the rod-like liquid crystal compound in a horizontally aligned state. In a case where a disk-like liquid crystal compound is used, it is preferable to fix the disk-like liquid crystal compound in a vertically aligned state.

In the present invention, "horizontal alignment of the rod-like liquid crystal compound" means that the director of the rod-like liquid crystal compound is parallel to the surface of the layer. Furthermore, in the present invention, "vertical alignment of the disk-like liquid crystal compound" means that the disk surface of the disk-like liquid crystal compound is perpendicular to the surface of the layer.

"Horizontal" and "vertical" do not mean that the liquid crystal compounds need to be precisely horizontally or vertically aligned, but means that there may be a difference within a range of 20° from the precise angle. The difference is preferably within ±5°, more preferably within ±3°, even more preferably within ±2°, and most preferably within ±1°.

In order to vertically or horizontally align the liquid crystal compounds, an additive (alignment control agent) facilitating the horizontal alignment or the vertical alignment may be used. As the additive, known additives can be used.

The λ/4 plate 16 (λ/4 retardation plate (retardation layer)) may be formed by a known method, and all known λ/4 plates can be used. Furthermore, commercially available products may be used as the λ/4 plate 16.

The thickness of the λ/4 plate 16 is not particularly limited. However, in order to obtain a thin λ/4 plate 16, the thickness is preferably 1 to 5 μm, more preferably 1 to 4 μm, and even more preferably 1 to 3 μm.

<Polarizer>

A polarizer 18 is provided on the light emitting side of the λ/4 plate 16.

The polarizer (polarizing plate) 18 is a known linear polarizer having a unidirectional transmission axis and used for an antireflection film of an organic EL display and the like.

Therefore, as the polarizer 18, it is possible to use various general linear polarizers such as an absorption-type polarizer including an iodine compound and a reflection-type polarizer such as a wire grid.

As described above, the polarizer 18 has, for example, a transmission axis in the transverse direction of FIG. 1.

<Action of Optical Device>

Hereinafter, the action of the optical device 10 will be described.

As described above, the transmission axis of the polarizer 18 is in the transverse direction in the drawing. Accordingly, in a case where external light E is incident on the optical device 10, the component of linearly polarized light in the transverse direction of the drawing is transmitted through the polarizer 18, and other components of linearly polarized light are absorbed into the polarizer 18.

The linearly polarized light transmitted through the polarizer 18 is converted into circularly polarized light by the λ/4 plate 16. As described above, the λ/4 plate 16 has a slow axis forming an angle of −45° with the transmission axis of the polarizer 18. Therefore, the light transmitted through the λ/4 plate 16 is converted into left-handed circularly polarized light.

The left-handed circularly polarized light converted from the external light is reflected from the metallic reflecting portion of the non-light emitting portion 12N of the organic EL substrate 12, turns into right-handed circularly polarized light of reverse sense of rotation, is incident on the λ/4 plate 16, and converted into linearly polarized light.

The sense of rotation of the right-handed circularly polarized light, which is reflected from the metallic reflecting portion of the non-light emitting portion 12N of the organic EL substrate 12 and incident on the λ/4 plate 16, is opposite to the sense of rotation of the left-handed circularly polarized light emitted from the λ/4 plate 16 as a result of transmission of the external light E as incidence ray through the polarizer 18. Therefore, the light converted into the linearly polarized light by the λ/4 plate 16 is linearly polarized light in the direction orthogonal to the transmission axis of the polarizer, and thus cannot be transmitted through the λ/4 plate 16. That is, the optical device 10 according to the embodiment of the present invention can prevent reflection of external light.

On the other hand, in the optical device 10 according to the embodiment of the present invention, the red light emitted from the R light emitting portion 12R of the organic EL substrate 12 is incident on the R circularly polarized light-separating member 14R, the green light emitted from the G light emitting portion 12G is incident on the G circularly polarized light-separating member 14G, and the blue light emitted from the B light emitting portion 12B is incident on the B circularly polarized light-separating member 14B.

Among the red light (non-polarized light), green light (non-polarized light), and blue light (non-polarized light) incident on the respective circularly polarized light-separating members, the component of left-handed circularly polarized light indicated by the fine broken line is transmitted through the circularly polarized light-separating layer 26 of the corresponding circularly polarized light-separating member as described above.

The left-handed circularly polarized light transmitted through the circularly polarized light-separating member (circularly polarized light-separating layer 26) is incident on the λ/4 plate 16 and converted into linearly polarized light.

As described above, the λ/4 plate 16 has a slow axis forming an angle of −45° with the transmission axis of the polarizer 18. Therefore, the direction of the linearly polarized light converted by the λ/4 plate 16 coincides with the direction of the transmission axis of the polarizer 18. Accordingly, the linearly polarized light converted by the λ/4 plate 16 is transmitted through the polarizer 18 and emitted from the optical device (arrow pointing upward in the figure).

In contrast, among the red light (non-polarized light), green light (non-polarized light), and blue light (non-polarized light) incident on the respective circularly polarized light-separating members, the component of right-handed circularly polarized light indicated by the thick broken line is reflected from circularly polarized light-separating layer 26 of the corresponding circularly polarized light-separating member as described above.

As described above, the circularly polarized light-separating layer 26 has a liquid crystal alignment pattern in which the optical axis continuously rotates in one direction. Therefore, the right-handed circularly polarized light reflected from the circularly polarized light-separating layer 26 is reflected not in a direction returning to the light emitting portions of the organic EL substrate 12 but in an oblique direction and is incident on the non-light emitting portion 12N of the organic EL substrate 12.

The right-handed circularly polarized light incident on the non-light emitting portion 12N of the organic EL substrate 12 is reflected from the metallic reflecting portion of the non-light emitting portion 12N and converted into left-handed circularly polarized light having a reversed sense of rotation.

Just as the left-handed circularly polarized light transmitted through the circularly polarized light-separating member (circularly polarized light-separating layer 26) described above, the left-handed circularly polarized light reflected from the metallic reflecting portion of the non-light emitting portion 12N is converted into linearly polarized light in the same direction as the direction of the transmission axis of the polarizer 18 by the λ/4 plate 16, transmitted through the polarizer 18, and emitted from the optical device (oblique arrow).

As described above, the optical device 10 according to the embodiment of the present invention can emit both the component of right-handed circularly polarized light and component of left-handed circularly polarized light emitted from the light emitting portions of the organic EL substrate 12. Therefore, the optical device 10 can greatly improve the light use efficiency compared to the conventional organic EL device absorbing either right-handed circularly polarized light or left-handed circularly polarized light by using a λ/4 plate and a polarizer.

That is, according to the optical device of the embodiment of the present invention, both the prevention of external light reflection and the improvement of utilization efficiency of light by organic EL can be accomplished in an organic EL display device and the like.

OTHER EMBODIMENTS

In the optical device 10 shown in FIG. 1, the R circularly polarized light-separating member 14R, the G circularly polarized light-separating member 14G, and the B circularly polarized light-separating member 14B corresponding to the R light emitting portion 12R, the G light emitting portion 12G, and the B light emitting portion 12B of the organic EL substrate 12 has, as a preferred aspect, the circularly polarized light-separating layers 26 among which one period Λ varies such that the order of sizes of wavelengths of the corresponding light coincides with the order of lengths of one period A of the liquid crystal alignment pattern.

The present invention is not limited to the above. For example, the R circularly polarized light-separating member 14R, the G circularly polarized light-separating member 14G, and the B circularly polarized light-separating member 14B may have circularly polarized light-separating layers in which one period A of the liquid crystal alignment pattern is the same.

However, in view of obtaining higher light use efficiency and the like, it is preferable that the circularly polarized light-separating member adjusts one period A of the liquid crystal alignment pattern according to the wavelength of the light emitted from the corresponding light emitting portion such that the order of sizes of wavelengths of the light coincides with the order of lengths of one period A.

In the optical device 10 shown in FIG. 1, the R circularly polarized light-separating member 14R, the G circularly polarized light-separating member 14G, and the B circularly polarized light-separating member 14B are spaced apart, but the present invention is not limited thereto.

Figure 6:
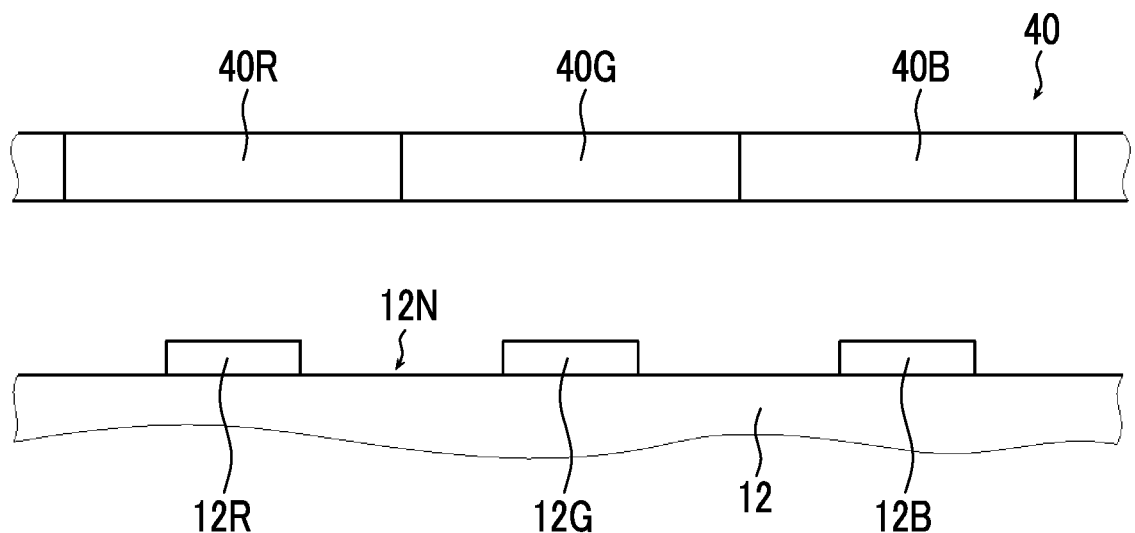
FIG. 6 is a conceptual view for illustrating another example of the optical device according to the embodiment of the present invention.

For example, just as the circularly polarized light-separating member 40 conceptually shown in FIG. 6, one circularly polarized light-separating member may be provided with an R circularly polarized light-separating region 40R, a G circularly polarized light-separating region 40G, and a B circularly polarized light-separating region 40B corresponding to the R light emitting portion 12R, the G light emitting portion 12G, and the B light emitting portion 12B of the organic EL substrate 12 respectively. In this case, it is preferable that the circularly polarized light-separating regions have circularly polarized light-separating layers among which one period A varies such that the order of sizes of wavelength of the corresponding light coincides with the order of lengths of one period A of the liquid crystal alignment pattern.

The circularly polarized light-separating member 40 can be prepared as below for example.

In a case where an alignment film is exposed using the exposure device 60 shown in FIG. 6, the area of the R circularly polarized light-separating region 40R is exposed in a state where other regions are shielded from light by masking. Then, the intersecting angle α of the two light rays MA and MB is changed, and the area of the G circularly polarized light-separating region 40G of the alignment film is exposed in a state where other regions are shielded from light by masking. Thereafter, the intersecting angle α of the two light rays MA and MB is changed, and the area of the B circularly polarized light-separating region 40B of the alignment film is exposed in a state where other regions are shielded from light by masking, thereby forming an alignment film.

In this way, by forming the alignment film, which is exposed by means of changing the intersecting angle α between the two light rays MA and MB, for each of the R circularly polarized light-separating region 40R, the G circularly polarized light-separating region 40G, and the B circularly polarized light-separating region 40B, and coating the region corresponding to the alignment film with the liquid crystal composition for forming a cholesteric liquid crystal layer corresponding to each of the circularly polarized light-separating regions by means of patterning so as to form circularly polarized light-separating layers, it is possible to prepare circularly polarized light-separating members shown in FIG. 6 among which one period A for each region varies according to each of the light emitting portions.

Figure 7:
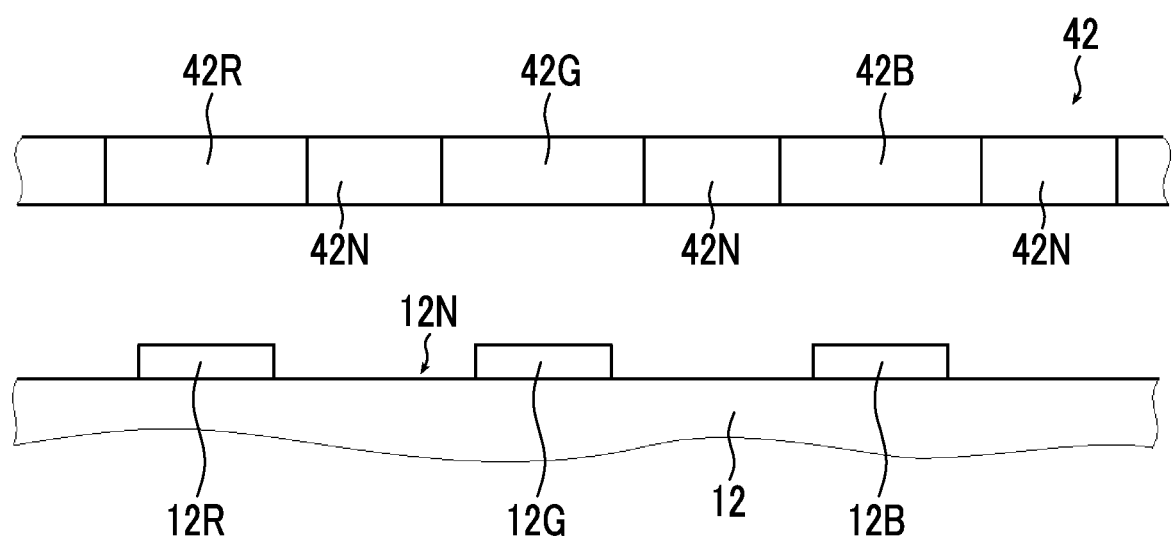
FIG. 7 is a conceptual view for illustrating another example of the optical device according to the embodiment of the present invention.

Furthermore, in a case where one circularly polarized light-separating member is provided for all the light emitting portions, and one period A of the circularly polarized light-separating layer is preferably adjusted for each region according to the wavelength of light, just as a circularly polarized light-separating member 42 conceptually illustrated in FIG. 7, the portion on which the light from the light emitting portion is not incident preferably has an isotropic region 42N, in which no liquid crystal compound is aligned, between the circularly polarized light-separating regions.

The circularly polarized light-separating layer formed by aligning liquid crystal compounds has a slightly high haze.

Furthermore, the circularly polarized light-separating layer, that is, the cholesteric liquid crystal layer selectively reflects light in a certain wavelength range. Therefore, in a case where external light is incident on the circularly polarized light-separating layer, the external light is likely to be scattered, and consequently, the incident external light is likely to be partially transmitted through λ/4 plate 16 and the polarizer 18 and emitted from the optical device, and thus the performance of preventing external light reflection is likely to deteriorate.

On the other hand, in a case where the portion, on which the light from the light emitting portion is not incident, between an R circularly polarized light-separating region 42R and a G circularly polarized light-separating region 42G, between the G circularly polarized light-separating region 42G and a B circularly polarized light-separating region 42B, and between the R circularly polarized light-separating region 42R and the B circularly polarized light-separating region 42B is provided as the isotropic region 42N in which no liquid crystal compound is aligned, the scattering of external light in the portion on which the light from the light emitting portion is not incident is prevented, and a higher performance of preventing external light reflection is obtained.

The circularly polarized light-separating member 42 having the isotropic region 42N shown in FIG. 7 can be prepared as below for example.

First, just as the circularly polarized light-separating member 40 shown in FIG. 6, masking is performed, and an alignment film is exposed using the exposure device 60 shown in FIG. 6 by changing the intersecting angle α of two light rays MA and MB.

Then, as described above, the area corresponding to each of the circularly polarized light-separating regions of the alignment film is coated with the liquid crystal composition that will become the circularly polarized light-separating layer corresponding to each of the circularly polarized light-separating regions by means of patterning. Thereafter, the area corresponding to the isotropic region 42N is masked, and in this state, the circularly polarized light-separating regions are exposed by being irradiated with ultraviolet. Subsequently, the whole surface of the layer is secondly irradiated with ultraviolet with heating such that the circularly polarized light-separating regions and the isotropic region 42N are cured (fixed). In this way, a circularly polarized light-separating member 42 (circularly polarized light-separating layer) is obtained which has circularly polarized light-separating regions having a liquid crystal alignment pattern and the isotropic region 42N in which no liquid crystal compound is aligned.

As a method of forming the circularly polarized light-separating member 42 having the isotropic region 42N shown in FIG. 7, the following method can also be used. First, in the process of performing masking and exposing the alignment film by using the exposure device 60 shown in FIG. 5 by changing the intersecting angle α of two light rays MA and MB so as to prepare the circularly polarized light-separating member 40 shown in FIG. 6 described above, the size of the light transmission portion of the mask corresponding to the areas of the R circularly polarized light-separating region 42R, the G circularly polarized light-separating region 42G, and the B circularly polarized light-separating region 42B is slightly reduced.

In this way, the area corresponding to the isotropic region 42N of the alignment film is shielded from light all the time and is not exposed, while the area corresponding to each of the circularly polarized light-separating regions is exposed.

As a result, an alignment film is formed which does not have an alignment pattern in the area corresponding to the isotropic region 42N but has an alignment pattern in the area corresponding to each of the circularly polarized light-separating regions.

In this manner, by coating the area corresponding to each of the circularly polarized light-separating regions of the alignment film, which does not have an alignment pattern in an area corresponding to the isotropic region 42N, with the liquid crystal composition that will become the circularly polarized light-separating layers corresponding to the circularly polarized light-separating regions by means of patterning so as to form circularly polarized light-separating layers, it is possible to form the circularly polarized light-separating member 42 (circularly polarized light-separating layer) including circularly polarized light-separating regions having a liquid crystal alignment pattern and the isotropic region 42N in which no liquid crystal compound is aligned.

As the liquid crystal composition for coating the isotropic region 42N, any liquid crystal composition may be used.

In the optical device according to the embodiment of the present invention, the circularly polarized light-separating member, the λ/4 plate 16, and the polarizer 18 can be integrally formed.

Figure 8:
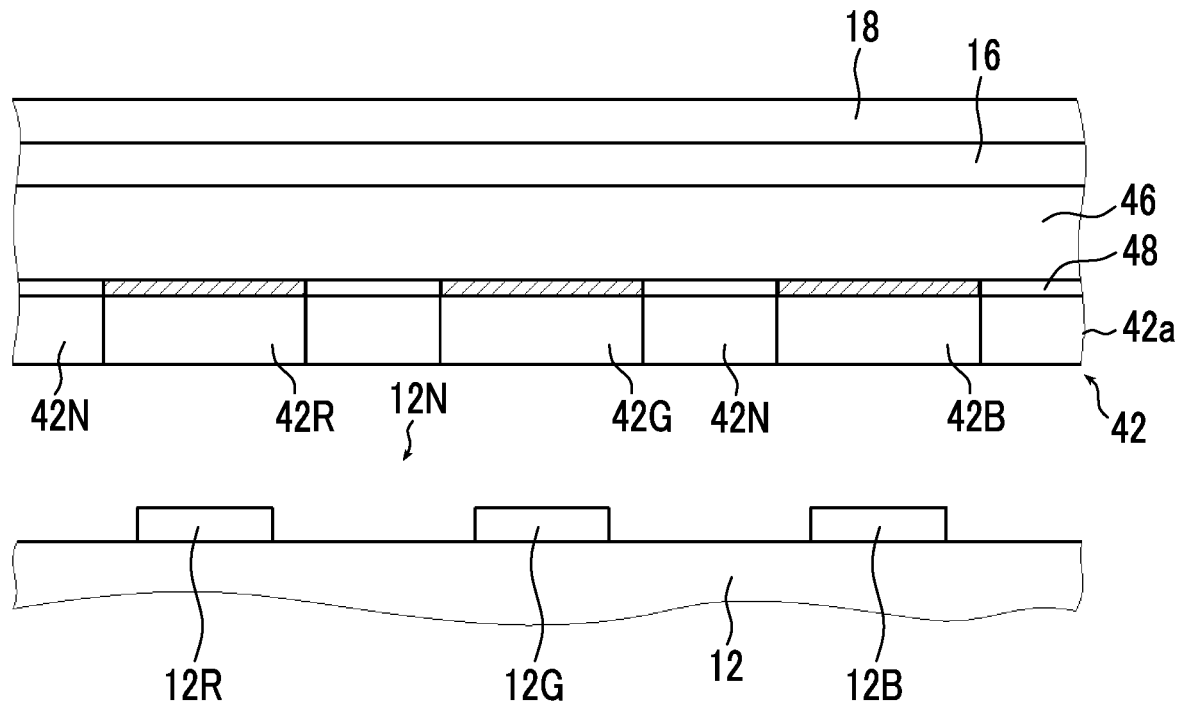
FIG. 8 is a conceptual view for illustrating another example of the optical device according to the embodiment of the present invention.

For example, as illustrated above by using the circularly polarized light-separating member 42 in FIG. 8, the optical device is constituted with the circularly polarized light-separating member 42, which is on one surface of a support 46 and consists of an alignment film 48 and a circularly polarized light-separating layer 42a, and λ/4 plate 16 and the polarizer 18 which are on the other surface of the support 46. In the alignment film 48, the shaded portion is a region where an alignment pattern is formed by the exposure device 60, and the white portion is a non-alignment region where no alignment pattern is formed.

Furthermore, in order to improve viewing angle characteristics and the like, the optical device according to the embodiment of the present invention may be provided with a birefringent layer for correcting viewing angle that is disposed in the middle of the optical path, for example, an optical compensation film having retardation in an in-plane direction or an out-of-plane direction, and the like.

The constitutions shown in FIGS. 6 to 8, the aforementioned optical compensation film, and the like can also be used in an optical device using a circularly polarized light-separating member 50R shown in FIGS. 9 and 10 which will be described later.

<Embodiments Other than Cholesteric Liquid Crystal Layer>

Figure 9:
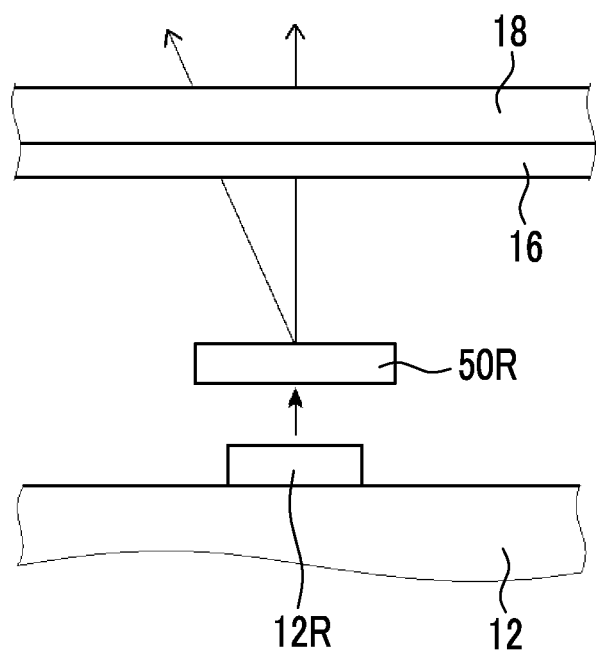
FIG. 9 is a conceptual view for illustrating another example of the optical device according to the embodiment of the present invention.

FIG. 9 shows another example of the optical device according to an embodiment of the present invention.

FIG. 9 shows only the circularly polarized light-separating member 50R separating circularly polarized red light corresponding to the R light emitting portion 12R. However, in the optical device shown in FIG. 9, as in the optical device 10 shown in FIG. 1, a circularly polarized light-separating member separating circularly polarized green light corresponding to the G light emitting portion 12G and a circularly polarized light-separating member separating circularly polarized blue light corresponding to the B light emitting portion 12B are arranged for each of the light emitting portions of the organic EL substrate 12.

Furthermore, the actions of the circularly polarized light-separating member 50R which will be described later, such as the separation of circularly polarized light (rectilinear transmission and refraction) and the conversion of sense of rotation, are also performed by a circularly polarized light-separating member (circularly polarized light-separating layer) for red light, a circularly polarized light-separating member (circularly polarized light-separating layer) for green light, and a circularly polarized light-separating member (circularly polarized light-separating layer) for blue light.

That is, in the aspect shown in FIG. 9 and FIG. 10 which will be described later, the circularly polarized light-separating layer separating circularly polarized red light, the circularly polarized light-separating layer separating circularly polarized green light, and the circularly polarized light-separating layer separating circularly polarized blue light are basically the same.

However, as will be described later, as a preferred aspect, one period A in which the optical axis 30A rotates 180° in the liquid crystal alignment pattern varies among the circularly polarized light-separating layer separating circularly polarized red light, the circularly polarized light-separating layer separating circularly polarized green light, and the circularly polarized light-separating layer separating circularly polarized blue light.

In the optical device according to an embodiment of the present invention, the circularly polarized light-separating layer has a liquid crystal alignment pattern in which the liquid crystal compound 30 is helically twisted and aligned along a helical axis extending in a thickness direction and the direction of the optical axis derived from the liquid crystal compound changes while continuously rotating along at least one direction in the plane.

In the optical device 10 described above, the circularly polarized light-separating layer is a cholesteric liquid crystal layer, in which the constitution of the stacked liquid crystal compounds 30 that helically rotate once (rotate 360°) is regarded as one pitch of a helix. The circularly polarized light-separating layer has a structure in which the helically revolving liquid crystal compounds 30 are laminated at plural pitches.

Figure 10:
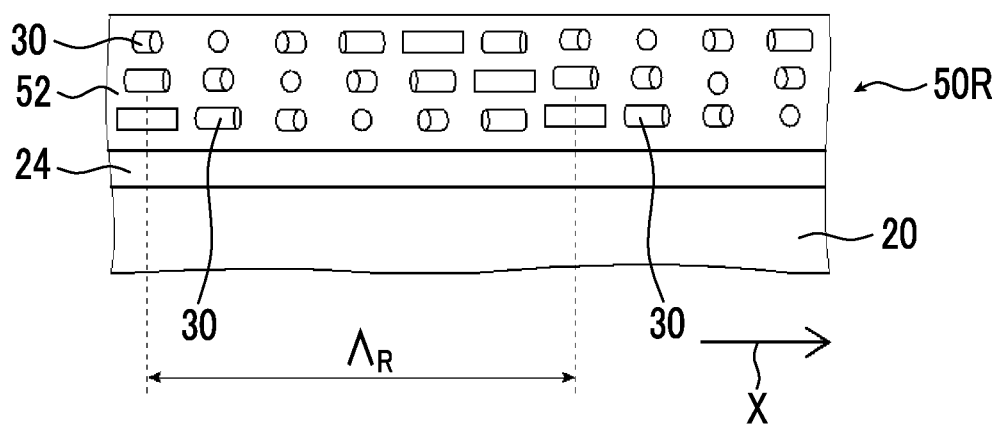
FIG. 10 is a conceptual view of a circularly polarized light-separating member of the optical device shown in FIG. 9.

On the other hand, in the circularly polarized light-separating member 50R shown in FIG. 9, as being conceptually shown in FIG. 10, the liquid crystal compound 30, which is in the circularly polarized light-separating layer 52 formed on the alignment film 24 and twisted and aligned along the helical axis extending in the thickness direction, rotate at a helical twist angle of, for example, 30° to 180° that is smaller than the angle by which the compound rotates once (rotates 360°). The helical twist angle of the liquid crystal compound 30 is preferably 40° to 120°, more preferably 50° to 100°, and even more preferably 60° to 90°. The twist angle of the liquid crystal compound 30 is not a short pitch of a wavelength order that exhibits so-called selective reflection but a pitch longer than the wavelength.

The circularly polarized light-separating layer 52 sets the helical twist angle of the liquid crystal compound 30 within the above range and adjusts $\Delta n_{550} \times d$, that is, birefringence to a certain value as will be described later, such that between left-handed circularly polarized light and right-handed circularly polarized light and right, one of the circularly polarized lights undergoes neither a change of sense of rotation nor a change of traveling direction and is rectilinearly transmitted and the other circularly polarized light undergoes reversal of sense of rotation and refraction and is thus transmitted in a bent traveling direction. In this aspect, these properties of the separation of circularly polarized light are exploited.

In the present invention, the twist angle of the twisted and aligned liquid crystal compound 30 refers to an angle of twist between the bottom surface of the liquid crystal compound 30, which is twisted and aligned along the helical axis extending in the thickness direction in the circularly polarized light-separating layer, and the top surface of the liquid crystal compound 30.

Just as the circularly polarized light-separating layer 26 described above, the circularly polarized light-separating layer 52 also has a liquid crystal alignment pattern in which the direction of the optical axis 30A derived from the liquid crystal compound changes while continuously rotating along at least one direction in the plane.

In the circularly polarized light-separating layer 52, an in-plane retardation for an incidence ray at a wavelength of 550 nm, which is represented by Re $(550)=\Delta n_{550} \times d$, is within the range defined by Equation (1). $\Delta n_{550}$ is the refractive index difference resulting from the refractive index anisotropy of the region Z in a case where the wavelength of an incidence ray is 550 nm, and d is the thickness of the circularly polarized light-separating layer 52.

$$200 \text{ nm} \leq \Delta n_{550} \times d \leq 350 \text{ nm} \quad (1)$$

The in-plane retardation Re $(550)=\Delta n_{550} \times d$ of a plurality of regions Z in the circularly polarized light-separating layer 52 preferably satisfies 225 nm≤$\Delta n_{550}$×d≤340 nm, and more preferably satisfies 250 nm≤$\Delta n_{550}$×d≤330 nm.

As described above, between the left-handed circularly polarized light and right-handed circularly polarized light incident on the circularly polarized light-separating layer 52, one of the circularly polarized lights is rectilinearly transmitted while maintaining the sense of rotation thereof and the other circularly polarized light undergoes the reversal of sense of rotation and is transmitted by being obliquely refracted. Which one of the left- and right-handed circularly polarized lights will undergo the reversal of sense of rotation and will be refracted by the circularly polarized light-separating layer 52 depends on the twisted direction (sense) of the helix of the liquid crystal compound 30 in the circularly polarized light-separating layer 52. That is, in a case where the liquid crystal compound 30 in the circularly polarized light-separating layer 52 is a right-handed helix, right-handed circularly polarized light undergoes the reversal of sense of rotation and is refracted, and left-handed circularly polarized light is rectilinearly transmitted while maintaining the sense of rotation thereof. Inversely, in a case where the liquid crystal compound 30 is a left-handed helix, by the circularly polarized light-separating layer 52, left-handed circularly polarized light undergoes the reversal of sense of rotation and is refracted, and right-handed circularly polarized light is rectilinearly transmitted while maintaining the sense of rotation thereof.

As shown in FIG. 10, the circularly polarized light-separating layer 52 illustrated in the drawing has a liquid crystal compound 30 that is a right-handed helix. Therefore, the circularly polarized light-separating layer 52 illustrated in the drawing rectilinearly transmits the component of left-handed circularly polarized light as it is among the (non-polarized) lights emitted from the R light emitting portion 12R. In contrast, the component of right-handed circularly polarized light is transmitted by being obliquely refracted and converted into left-handed circularly polarized light.

Therefore, both the left-handed circularly polarized light and right-handed circularly polarized light incident on the circularly polarized light-separating member 50R (circularly polarized light-separating layer 52) turn into left-handed circularly polarized light, are incident on the λ/4 plate 16, converted into linearly polarized light in a direction that coincides with the direction of the transmission axis of the polarizer 18 by the λ/4 plate 16, transmitted through the polarizer 18, and emitted from the optical device.

Just as the optical device 10 shown in FIG. 1, the optical device shown in FIG. 9 also has the action of preventing external light reflection.

Accordingly, with the optical device using the circularly polarized light-separating member 50R, both the prevention of external light reflection and the improvement of utilization efficiency of light by organic EL can be accomplished in an organic EL display device and the like.

As described above, in a case where the direction of rotation of the optical axis derived from the liquid crystal compound is reversed, the right-handed circularly polarized light and the left-handed circularly polarized light that will be rectilinearly transmitted, refracted, and undergo the reversal of direction of rotation by the circularly polarized light-separating layer 52 are switched.

Furthermore, regarding the extent of refraction, as in the circularly polarized light-separating layer 26 described above and the like, the longer the wavelength of light is, and the shorter the one period A is in which the optical axis 30A rotates 180° in the liquid crystal alignment pattern, the further the light is refracted. Accordingly, even for the circularly polarized light-separating layer shown in FIGS. 9 and 10, as described above, it is preferable that the order of sizes of wavelengths of the corresponding light coincides with the order of lengths of one period A in the circularly polarized light-separating layer corresponding to each of the red light, green light, and blue light.

As the R circularly polarized light-separating member 50R (circularly polarized light-separating layer 52), various known members can be used.

Examples thereof include the optical member described in K. Gao, et al, Optics Express, 25 (2017) 6283 and the like.

Hitherto, the optical device according to the embodiment of the present invention has been specifically described. However, the present invention is not limited to the examples described above. It goes without saying that the present invention may be ameliorated or modified in various ways, within a scope that does not depart from the gist of the present invention.

EXAMPLES

Hereinafter, the features of the present invention will be more specifically described based on examples. The materials, reagents, amounts thereof used, amount of substances, ratios, details of treatments, procedures of treatments, and the like shown in the following examples can be appropriately changed as long as the gist of the present invention is maintained. Accordingly, the scope of the present invention should not be limited to the specific examples described below.

Example 1

<Preparation of Organic EL Substrate>

A commercially available organic EL display device (manufactured by SAMSUNG, SC-04E) including an R light emitting portion (red organic electroluminescent layer), a G light emitting portion (green organic electroluminescent layer), and a B light emitting portion (blue organic electroluminescent layer) was prepared.

From this organic EL display device, a polarizing plate and an optical film were removed, and the surface of a barrier layer protecting a light emitting element was exposed. The substance obtained in this way was used as an organic EL substrate.

In this organic EL substrate, the R light emitting portion has an emission spectrum with a central wavelength of 650 nm and an emission bandwidth of 50 nm, the G light emitting portion has an emission spectrum with a central wavelength of 550 nm and an emission bandwidth of 45 nm, and the B light emitting portion has an emission spectrum with a central wavelength of 450 nm and an emission bandwidth of 40 nm.

<Preparation of Support>

As a support, an acrylic film was prepared using the method described in WO2017/033468A. The thickness of the prepared support was 80 μm, and the value of in-plane and out-of-plane retardation (Re) of the support was zero.

<Formation of Support with Photo Alignment Film>

One surface of the support was coated with 1% by mass aqueous solution of a photo alignment material E-1 having the following structure and dried for 1 minute at 100° C.

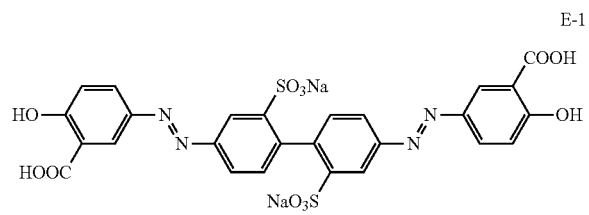

E-1

The obtained coating film was irradiated with ultraviolet in the air through a wire grid polarizer (manufactured by MOXTEK, Inc. ProFlux PPL02) by using an air-cooled metal halide lamp at 160 W/cm² (manufactured by EYE GRAPHICS Co., Ltd.), thereby preparing a support with a photo alignment film.

<Formation of λ/4 Retardation Plate (λ/4 Plate)>

The following composition for a λ/4 retardation layer was prepared.

(Composition for λ/4 Retardation Layer)

| | |
|---|---|
| The following rod-like liquid crystal compound (manufactured by BASF SE, LC242) | 100 parts by mass |
| The following horizontal alignment agent A | 0.3 parts by mass |
| Photopolymerization initiator (manufactured by BASF SE, IRGACURE 907) | 3.3 parts by mass |
| Sensitizer (manufactured by Nippon Kayaku Co., Ltd., KAYACURE-DETX) | 1.1 parts by mass |
| Methyl ethyl ketone | 300 parts by mass |

Rod-like liquid crystal LC242: rod-like liquid crystal described in WO2010/090429A2

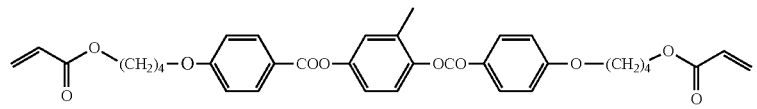

Horizontal alignment agent A

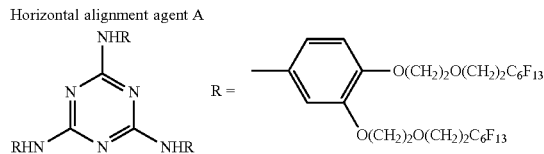

The prepared composition for a λ/4 retardation layer was filtered through a polypropylene filter having a pore size of 0.2 μm.

The photo alignment film of the prepared support was coated with the filtered composition for a λ/4 retardation layer, and the composition was dried for 2 minutes at a film surface temperature of 105° C. such that the composition was in a state of liquid crystalline phase. Then, the composition was cooled to 75° C., irradiated with ultraviolet rays in the air by using an air-cooled metal halide lamp (manufactured by EYE GRAPHICS Co., Ltd.) at 160 W/cm² such that the alignment state thereof is fixed, thereby forming a λ/4 retardation layer on the support and preparing a λ/4 plate.

The film thickness of the retardation layer was 1.3 μm. Re (550) was 130 nm.

<Bonding of Polarizer>

By using an adhesive (manufactured by Soken Chemical & Engineering Co., Ltd., SK-DYNE 2057), a wire grid polarizer (manufactured by MOXTEK, Inc., ProFlux PPL02) was bonded to the λ/4 retardation layer.

At this time, the λ/4 retardation layer and the wire grid polarizer were positioned such that the slow axis of the λ/4 retardation layer and the transmission axis of the wire grid polarizer intersected at −45°.

<Preparation of Circularly Polarized Light-Separating Member>

A surface of the support opposite to the surface, on which the λ/4 retardation layer was formed, was continuously coated with the following coating solution for forming an undercoat layer by using a #8 wire bar. The support on which the coating film was formed was dried with hot air for 60 seconds at 60° C. and then further dried with hot air for 120 seconds at 100° C., thereby forming an undercoat layer.

(Coating Solution for Forming Undercoat Layer)

| | |
|---|---|
| The following modified polyvinyl alcohol | 2.40 parts by mass |
| Isopropyl alcohol | 1.60 parts by mass |
| Methanol | 36.00 parts by mass |
| Water | 60.00 parts by mass |

Modified polyvinyl alcohol

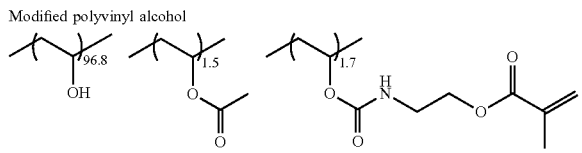

<<Formation of Alignment Film>>

The support on which the undercoat layer was formed was continuously coated with the following coating solution for forming an alignment film by using a #2 wire bar. The support on which the coating film of the coating solution for forming an alignment film was formed was dried on a hot plate for 60 seconds at 60° C., thereby forming an alignment film.

(Coating Solution for Forming Alignment Film)

| The following material A for photo alignment | 1.00 part by mass |
| --- | --- |
| Water | 16.00 parts by mass |
| Butoxy ethanol | 42.00 parts by mass |
| Propylene glycol monomethyl ether | 42.00 parts by mass |

-Material A for photo alignment-

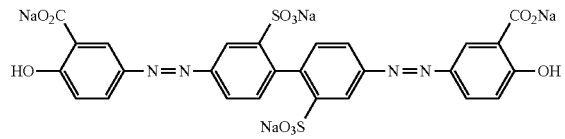

<<Exposure of Alignment Film>>

The alignment film was exposed using the exposure device shown in FIG. 6, thereby forming an alignment film having an alignment pattern.

In the exposure device, a laser that emits laser beam having a wavelength (325 nm) was used. The exposure amount by the interference light was set to 100 mJ/cm². One period (a length over which an optical axis derived from a liquid crystal compound rotates) 180° of the alignment pattern formed by two laser beams and interference was controlled by changing the intersecting angle (intersecting angle α) of two lights.

<<Formation of Circularly Polarized Light-Separating Layer>>

A liquid crystal composition LC-B shown below was prepared.

The liquid crystal composition LC-B is a composition for forming a cholesteric liquid crystal layer exhibiting selective reflexibility at a selective reflection center wavelength of 450 nm in a selective wavelength range of 89 nm.

(Liquid Crystal Composition LC-B)

| The following rod-like liquid crystal compound L-1 | 19.57 parts by mass |
| --- | --- |
| The following horizontal alignment agent T-1 | 0.015 parts by mass |
| The following chiral agent Ch | 1.49 parts by mass |
| Photopolymerization initiator (manufactured by BASF SE, IRGACURE 907) | 0.587 parts by mass |
| Photosensitizer (manufactured by Nippon Kayaku Co., Ltd., KAYACURE DETX-S) | 0.916 parts by mass |
| Polymerization control agent (manufactured by BASF, SE IRGANOX1076) | 0.078 parts by mass |
| Methyl ethyl ketone | 80.0 parts by mass |

Rod-like liquid crystal compound L-1

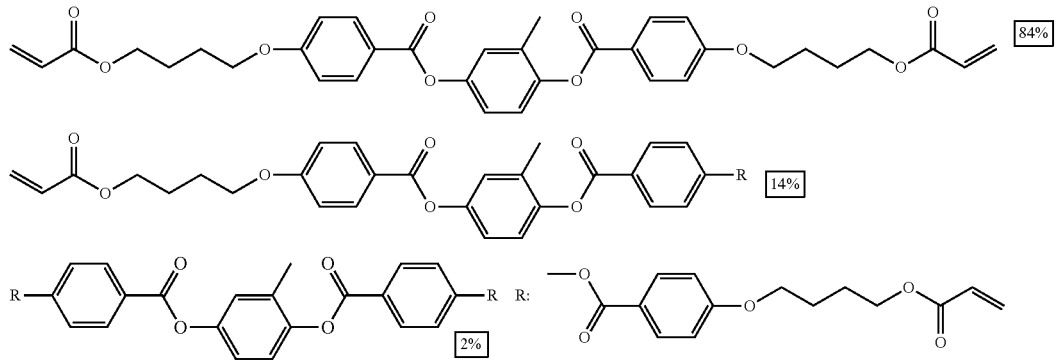

Horizontal alignment agent T-1

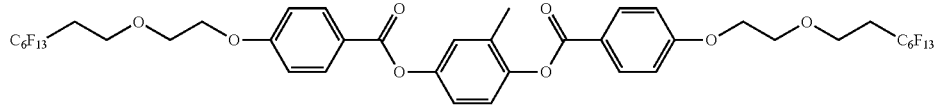

Chiral agent Ch

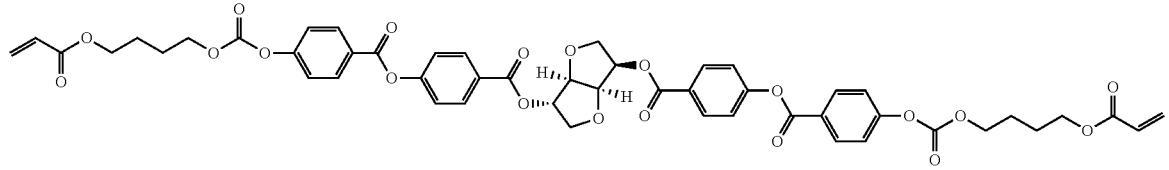 [SMILES: C=CC(=O)OCCCCOC(=O)Oc1ccc(C(=O)Oc2ccc(C(=O)O[C@H]3CO[C@H]4[C@@H]3OC[C@H]4OC(=O)c3ccc(OC(=O)c4ccc(OC(=O)OCCCCOC(=O)C=C)cc4)cc3)cc2)cc1]

A liquid crystal composition LC-G was prepared in the same manner as that adopted for preparing the liquid crystal composition LC-B, except that the content of the chiral agent Ch in the liquid crystal composition LC-B was changed to 1.22 parts by mass from 1.49 parts by mass.

The liquid crystal composition LC-G is a composition for forming a cholesteric liquid crystal layer exhibiting selective reflexibility at a selective reflection center wavelength of 550 nm in a selective wavelength range of 109 nm.

A liquid crystal composition LC-R was prepared in the same manner as that adopted for preparing the liquid crystal composition LC-B, except that the content of the chiral agent Ch in the liquid crystal composition LC-B was changed to 1.03 parts by mass from 1.49 parts by mass.

The liquid crystal composition LC-R is a composition for forming a cholesteric liquid crystal layer exhibiting selective reflexibility at a selective reflection center wavelength of 650 nm in a selective wavelength range of 129 nm.

Alignment films having undergone exposure were coated with the prepared liquid crystal compositions LC-R, LC-G, and LC-B. A region corresponding to an R light emitting portion of the organic EL substrate was coated with the liquid crystal composition LC-R by patterning, a region corresponding to a B light emitting portion of the organic EL substrate was coated with the liquid crystal composition LC-B by patterning, and a region corresponding to a G light emitting portion of the organic EL substrate was coated with the liquid crystal composition LC-G by patterning. Then, the compositions were dried.

Thereafter, each of the liquid crystal compositions coating the alignment film was allowed to age by being heated at a film surface temperature of 95° C. for 60 seconds, and then the liquid crystal composition LC-1 was immediately exposed in the air at 25° C. by using an ultrahigh-pressure mercury lamp (manufactured by Canon Inc., PLA-501F exposure machine) at an exposure amount of 100 mJ/cm$^2$, thereby forming a circularly polarized light-separating layer.

In this way, a laminate was prepared which had a λ/4 plate (λ/4 plate retardation layer) and a polarizer on one surface of a support and had a circularly polarized light-separating member (circularly polarized light-separating layer) including an R circularly polarized light-separating region, a G circularly polarized light-separating region, and a B circularly polarized light-separating region shown in FIG. 6 on the other surface of the support (see FIG. 8).

By using a polarizing microscope, it was confirmed that the circularly polarized light-separating member is a periodic alignment surface shown in FIG. 3. In the liquid crystal alignment pattern of each of the circularly polarized light-separating layers, one period in which the optical axis derived from the liquid crystal compound rotates 180° was constant at 1 μm.

Furthermore, as a result of observing the cross section of the circularly polarized light-separating member by using a scanning electron microscope, the liquid crystal compound was found to be aligned in a state of being helically twisted 2,880° (making 8 rotations=8 pitches) in the circularly polarized light-separating layers of the R circularly polarized light-separating region, the G circularly polarized light-separating region, and the B circularly polarized light-separating region.

The prepared laminate and the organic EL substrate prepared in advance were combined by positioning the R light emitting portion, the G light emitting portion, and the B light emitting portion of the organic EL substrate and the R circularly polarized light-separating region, the G circularly polarized light-separating region, and the B circularly polarized light-separating region of the circularly polarized light-separating member, thereby preparing the optical device according to an embodiment of the present invention.

Example 2

For performing exposure by using the exposure device shown in FIG. 6 so as to form an alignment film for forming a circularly polarized light-separating layer, first, an alignment film was exposed through a mask in which only a region corresponding to an R light emitting portion of an organic EL substrate is a light transmission portion and other regions are light shielding portions.

Then, the intersecting angle α of two light rays MA and MB was changed, and the alignment film was exposed through a mask in which only a region corresponding to a G light emitting portion of the organic EL substrate is a light transmission portion and other regions are light shielding portions.

Thereafter, the intersecting angle α of two light rays MA and MB was changed, and the alignment film was exposed through a mask in which only a region corresponding to a B light emitting portion of the organic EL substrate is a light transmission portion and other regions are light shielding portions.

An optical device according to an embodiment of the present invention was prepared by preparing a circularly polarized light-separating member in the same manner as in Example 1, except that the exposure in the process of forming an alignment film for forming a circularly polarized light-separating layer was performed as above.

By using a polarizing microscope, it was confirmed that the circularly polarized light-separating member is a periodic alignment surface shown in FIG. 3. Here, as being conceptually shown in FIG. 6, the prepared circularly polarized light-separating member had an R circularly polarized light-separating region, a G circularly polarized light-separating region, and a B circularly polarized light-separating region among which one period, in which the optical axis derived from the liquid crystal compound in the liquid crystal alignment pattern rotates 180°, varies.

In each of the circularly polarized light-separating regions, one period in which the optical axis derived from the liquid crystal compound in the liquid crystal alignment pattern of the circularly polarized light-separating layer rotates 180° was 1.44 μm for the R circularly polarized light-separating region, 1.22 μm for the G circularly polarized light-separating region, and 1 μm for the B circularly polarized light-separating region.

Furthermore, in the same manner as in Example 1, it was confirmed that in all of the circularly polarized light-separating regions of the circularly polarized light-separating layer, the liquid crystal compound was aligned in a state of being helically twisted at 2,880° (making 8 rotations=8 pitches).

Example 3

An alignment film was exposed in the same manner as in Example 2, thereby forming an alignment film for forming a circularly polarized light-separating layer.

The alignment film was coated with the liquid crystal compositions LC-R, LC-G, and LC-B in the same manner as in Example 1.

Figure 11:
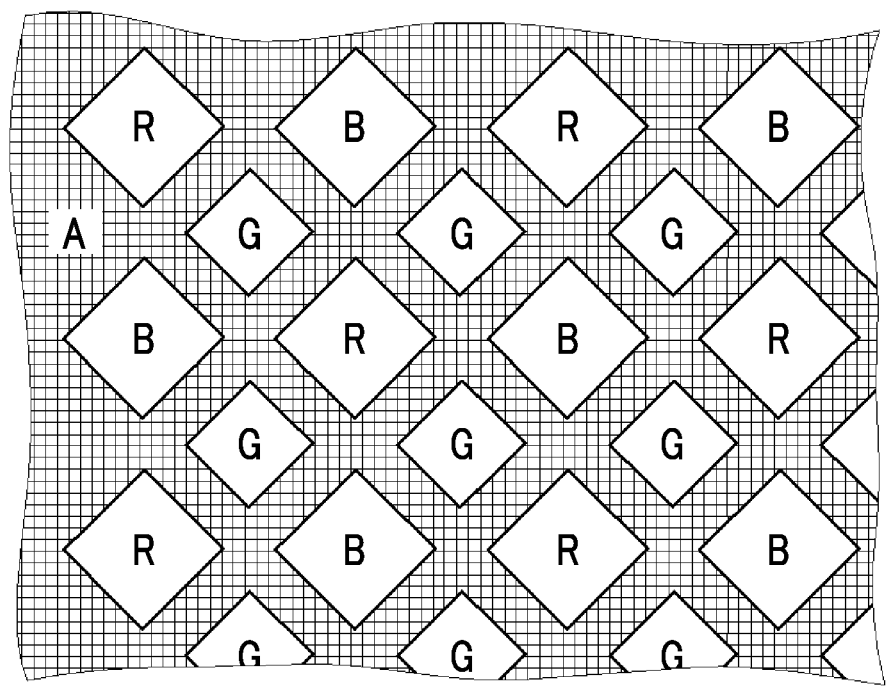
FIG. 11 is a conceptual view for illustrating an example of the present invention.

Thereafter, the liquid crystal composition LC-1 was allowed to age by being heated at a film surface temperature of 95° C. for 60 seconds and then immediately exposed through the mask conceptually shown in FIG. 11 in the air at 25° C. by using an ultrahigh-pressure mercury lamp (manufactured by Canon Inc., PLA-501F exposure machine) at an exposure amount of 100 mJ/cm$^2$.

In the mask shown in FIG. 11, the portion of the gridded region A is a light shielding portion, and other regions R, G, and B are light transmission portions. In terms of position, the regions R, G, and B correspond to the R light emitting portion, the G light emitting portion, and the B light emitting portion of the organic EL substrate respectively.

Then, while the entirety of the composition was being heated for 5 minutes at 200° C., the liquid crystal composition LC-1 was exposed again in nitrogen by using an air-cooled metal halide lamp (manufactured by EYE GRAPHICS Co., Ltd.) at an exposure amount of 500 mJ/cm$^2$, thereby forming a circularly polarized light-separating layer.

An optical device according to an embodiment of the present invention was prepared in the same manner as in Example 1, except that the circularly polarized light-separating member was formed in this manner.

By using a polarizing microscope, it was confirmed that the circularly polarized light-separating member is a periodic alignment surface shown in FIG. 3. Here, as being conceptually shown in FIGS. 7 and 8, the prepared circularly polarized light-separating member had an isotropic region in which no liquid crystals are aligned, in addition to an R circularly polarized light-separating region, a G circularly polarized light-separating region, and a B circularly polarized light-separating region among which one period, in which the optical axis derived from the liquid crystal compound in the liquid crystal alignment pattern rotates 180°, varies.

In each of the circularly polarized light-separating regions, one period in which the optical axis in the liquid crystal alignment pattern of the circularly polarized light-separating layer rotates 180° was the same as one period in Example 2. Furthermore, in the same manner as in Example 1, it was confirmed that in all of the circularly polarized light-separating regions of the circularly polarized light-separating layer, the liquid crystal compound was aligned in a state of being helically twisted at 2,880° (making 8 rotations=8 pitches).

Example 4

In the same manner as in Example 1, an acrylic film was prepared as a support. The thickness of the support was 10 µm. The value of in-plane and out-of-plane retardation (Re) of the prepared support was approximately zero. A photo alignment film was formed on this support in the same manner as in Example 1.

A liquid crystal composition LC-N was prepared in the same manner as that adopted for preparing the liquid crystal composition LC-B, except that the content of the chiral agent Ch in the liquid crystal composition LC-B was changed to 0.5 parts by mass from 1.49 parts by mass.

An optical device according to an embodiment of the present invention was prepared in the same manner as in Example 1, except that a circularly polarized light-separating layer was formed by coating the entire surface of the photo alignment film with the liquid crystal composition LC-N instead of the liquid crystal compositions LC-R, LC-G, and LC-B.

By using a polarizing microscope, it was confirmed that the circularly polarized light-separating layer has Re (550) (=$\Delta n_{550} \times d$) of 275 nm and is a periodic alignment surface shown in FIG. 3. In the liquid crystal alignment pattern of the circularly polarized light-separating layer, one period in which the optical axis derived from the liquid crystal compound rotates 180° was the same as one period in Example 1.

Furthermore, by using the aforementioned Axoscan and the attached measurement and analysis software, the twist angle of the helix of the liquid crystal compound in the circularly polarized light-separating layer was determined. As a result, the twist angle of the helix of the liquid crystal compound was 75°.

Example 5

An optical device according to an embodiment of the present invention was prepared in the same manner as in Example 2, except that the same support as that in Example 4 was used, and a circularly polarized light-separating layer was formed by coating the entire surface of the photo alignment film with the liquid crystal composition LC-N instead of the liquid crystal compositions LC-R, LC-G, and LC-B.

By using a polarizing microscope, it was confirmed that the circularly polarized light-separating layer has Re (550) (=$\Delta n_{550} \times d$) of 275 nm and is a periodic alignment surface shown in FIG. 3. Here, as being conceptually shown in FIG. 6, the prepared circularly polarized light-separating member had an R circularly polarized light-separating region, a G circularly polarized light-separating region, and a B circularly polarized light-separating region among which one period, in which the optical axis derived from the liquid crystal compound in the liquid crystal alignment pattern rotates 180°, varies. In each of the circularly polarized light-separating regions, one period in which the optical axis derived from the liquid crystal compound in the liquid crystal alignment pattern of the circularly polarized light-separating layer rotates 180° was the same as one period in Example 2.

In addition, in the same manner as in Example 4, it was confirmed that the twist angle of the helical liquid crystal compound in the circularly polarized light-separating layer is 75°.

Example 6

An optical device according to an embodiment of the present invention was prepared in the same manner as in Example 3, except that the same support as that in Example 4 was used, and a circularly polarized light-separating layer was formed by coating the entire surface of the photo alignment film with the liquid crystal composition LC-N instead of the liquid crystal compositions LC-R, LC-G, and LC-B.

By using a polarizing microscope, it was confirmed that the circularly polarized light-separating layer has Re (550) (=$\Delta n_{550} \times d$) of 275 nm and is a periodic alignment surface shown in FIG. 3. As being conceptually shown in FIGS. 7 and 8, the prepared circularly polarized light-separating member had an isotropic region in which no liquid crystals are aligned, in addition to an R circularly polarized light-separating region, a G circularly polarized light-separating region, and a B circularly polarized light-separating region among which one period, in which the optical axis derived from the liquid crystal compound in the liquid crystal alignment pattern rotates 180°, varies. In each of the circularly polarized light-separating regions, one period in which the optical axis derived from the liquid crystal compound in the liquid crystal alignment pattern of the circularly polarized light-separating layer rotates 180° was the same as one period in Example 2.

In addition, in the same manner as in Example 4, it was confirmed that the twist angle of the helical liquid crystal compound in the circularly polarized light-separating layer is 75°.

Comparative Example 1

A laminate was prepared without forming a circularly polarized light-separating member on a surface opposite to the surface of the support on which the λ/4 retardation layer was formed, and the laminate was combined with the same organic EL substrate as that in Example 1, thereby preparing an optical device. That is, in this example, the laminate is constituted with a support, a λ/4 retardation layer, and a polarizer laminated in this order.

[Evaluation]

Various optical devices prepared as above were evaluated in terms of light use efficiency (luminous flux) and external light reflection.

<Light Use Efficiency (Luminous Flux)>

All the light emitting portions of the optical device were turned on, and then the luminous flux from the surface of the optical device was measured using a spectral luminometer (manufactured by Labsphere, illumia lite).

The rate of improvement of luminous flux of each of the image display devices of examples relative to the luminous flux of Comparative Example 1 was evaluated. Therefore, the rate of improvement of luminous flux of Comparative Example 1 is 0%.

The evaluation standard is as follows. A and B are ranges in which a significant effect is recognized.

A: The rate of improvement of luminous flux is equal to or higher than 15%.

B: The rate of improvement of luminous flux is equal to or higher than 10% and less than 15%.

C: The rate of improvement of luminous flux is equal to or higher than 5% and less than 10%.

D: The rate of improvement of luminous flux is less than 5%.

<External Light Reflection>

All the light emitting portions of the optical device were turned on. In this state, an LED light source was allowed to be incident on the optical device in a direction forming an angle of 60° with the normal direction of the optical device (direction orthogonal to the light emitting surface), and the brightness values of light reflected in a direction of −58° were measured to determine a reflectance [%]. For measuring the reflectance, SR-3UL1 (manufactured by TOPCON CORPORATION) was used.

The evaluation standard is as follows.

A: The reflectance was equal to or higher than 2% and less than 4%.

B: The reflectance was equal to or higher than 4% and less than 6%.

C: The reflectance was equal to or higher than 6% and less than 8%.

D: The reflectance was equal to or higher than 8%.

The results are shown in the following table.

TABLE 1

| | | Comparative Example 1 | Example 1 | Example 2 | Example 3 |
|---|---|---|---|---|---|
| Circularly polarized light-separating layer | Presence or absence | Absent | Present | Present | Present |
| | Twist angle of helix of liquid crystal compound [°] | — | 2,880 | 2,880 | 2,880 |
| | Length of one period corresponding to RGB light | — | Uniform | R > G > B | R > G > B |
| | Isotropic region | — | Absent | Absent | Present |
| Evaluation | Light use efficiency (luminous flux) | D | B | A | A |
| | Reflection of external light (reflectance) | A | B | B | A |

| | | Example 4 | Example 5 | Example 6 |
|---|---|---|---|---|
| Circularly polarized light-separating layer | Presence or absence | Present | Present | Present |
| | Twist angle of helix of liquid crystal compound [°] | 75 | 75 | 75 |
| | Length of one period corresponding to RGB light | Uniform | R > G > B | R > G > B |
| | Isotropic region | Absent | Absent | Present |
| Evaluation | Light use efficiency (luminous flux) | B | A | A |
| | Reflection of external light (reflectance) | B | B | A |

The twist angle of a helix of 2,880° means that the helix makes 8 rotation.
RGB light is the light emitted from the light emitting portions of the organic EL substrate, and the length of one period is the length of one period in a region corresponding to light of each color.
In Examples 4 to 6, Re (550) of the circularly polarized light-separating layer is 275 nm.

As shown in the above table, the optical device according to an embodiment of the present invention having a circularly polarized light-separating layer separating light into right-handed circularly polarized light and left-handed circularly polarized light can improve the light use efficiency and can suitably prevent the reflection of external light.

Particularly, the light use efficiency is high in Examples 2 and 3 and Examples 5 and 6 wherein one period, in which the optical axis in the liquid crystal alignment pattern rotates 180°, in the circularly polarized light-separating layer increases as the wavelength of light incident on a region increases according to red light (R), green light (G), and blue light (B). Particularly, in Examples 3 and 6 in which a region of the circularly polarized light-separating layer, on which the light from the light emitting portions of the organic EL substrate is not incident, is used as an isotropic region, both the high light use efficiency and low reflectance can be obtained, and the effects are marked.

In contrast, in Comparative Example 1 which is a conventional optical device without a circularly polarized light-separating layer, although the performance of preventing external light reflection is high, the light use efficiency is low and cannot be simultaneously obtained with low reflectance.

The above results clearly show the effects of the present invention.

The present invention can be suitably used in various optical devices using organic EL such as an organic EL display device and an organic EL lighting device.

Explanation of References 10 optical device
12 organic EL substrate
12R R light emitting portion
12G G light emitting portion
12B B light emitting portion
12N non-light emitting portion
14R R circularly polarized light-separating member
14G G circularly polarized light-separating member
14B B circularly polarized light-separating member
16 λ/4 plate
18 polarizer
20, 46 support
24, 48 alignment film
26, 42a circularly polarized light-separating layer
30 liquid crystal compound
30A optical axis
40, 42 circularly polarized light-separating member
40R, 42R R circularly polarized light-separating region
40G, 42G G circularly polarized light-separating region
40B, 42B B circularly polarized light-separating region
42N isotropic region
60 exposure device
62 laser
64 light source
68 beam splitter
70A, 70B mirror
72A, 72B λ/4 plate
$R_R$ Right-handed circularly polarized light
M laser beam
MA, MB light rays
$P_O$ linearly polarized light
$P_R$ right-handed circularly polarized light
$P_L$ left-handed circularly polarized light
Q1, Q2 absolute phase
E1, E2 equiphase plane
Z, A, R, G, B region

What is claimed is:

1. An optical device comprising, in the following order:
an organic electroluminescent substrate having light emitting portions by organic electroluminescence and a non-light emitting portion which has a metallic reflecting portion;
a circularly polarized light-separating layer that is formed using a composition including a liquid crystal compound and has a liquid crystal alignment pattern in which the liquid crystal compound is twisted and aligned along a helical axis extending in a thickness direction and a direction of an optical axis derived from the liquid crystal compound changes while continuously rotating in a plane along at least one direction in the plane;
a λ/4 plate; and
a polarizer.

2. The optical device according to claim 1, wherein the circularly polarized light-separating layer transmits one of left-handed circularly polarized light and right-handed circularly polarized light and reflects the other such that light emitted from the light emitting portions of the organic electroluminescent substrate is separated into right-handed circularly polarized light and left-handed circularly polarized light.

3. The optical device according to claim 1, wherein the circularly polarized light-separating layer rectilinearly transmits one of right-handed circularly polarized light and left-handed circularly polarized light and refractively transmits the other such that light emitted from the light emitting portions of the organic electroluminescent substrate is separated into right-handed circularly polarized light and left-handed circularly polarized light.

4. The optical device according to claim 3, wherein the circularly polarized light-separating layer also reverses a sense of rotation of the refractively transmitted circularly polarized light.

5. The optical device according to claim 1, wherein the organic electroluminescent substrate has the light emitting portions emitting light having different wavelengths.

6. The optical device according to claim 5, wherein in a case where a length, over which the direction of the optical axis derived from the liquid crystal compound rotates 180° in one direction along which the direction of the optical axis derived from the liquid crystal compound changes while continuously rotating in the liquid crystal alignment pattern of the circularly polarized light-separating layer, is regarded as one period, the optical device has a plurality of kinds of circularly polarized light-separating layers whose lengths of the one period varies one another.

7. The optical device according to claim 6, wherein in the plurality of kinds of the circularly polarized light-separating layer, depending on a wavelength of an incidence ray, the longer the wavelength of the incidence ray incident on a portion, the longer the one period in the portion.

8. The optical device according to claim 1, wherein the circularly polarized light-separating layer has an isotropic region in which no liquid crystal compound is aligned.

9. The optical device according to claim 8, wherein the isotropic region is provided in a region on which light from the light emitting portions of the organic electroluminescent substrate is not incident.

10. The optical device according to claim 1, further comprising: a support, wherein one surface of the support is provided with the circularly polarized light-separating layer and the other surface of the support is provided with the λ/4 plate and the polarizer.

* * * * *